US012603637B2

(12) United States Patent
Ohnishi

(10) Patent No.: US 12,603,637 B2
(45) Date of Patent: Apr. 14, 2026

(54) PIEZOELECTRIC VIBRATION DEVICE AND MANUFACTURING METHOD THEREFOR

(71) Applicant: Daishinku Corporation, Kakogawa (JP)

(72) Inventor: Manabu Ohnishi, Kakogawa (JP)

(73) Assignee: Daishinku Corporation, Kakogawa (JP)

( * ) Notice: Subject to any disclaimer, the term of this patent is extended or adjusted under 35 U.S.C. 154(b) by 1058 days.

(21) Appl. No.: 17/762,769

(22) PCT Filed: Jul. 29, 2020

(86) PCT No.: PCT/JP2020/029024
§ 371 (c)(1),
(2) Date: Mar. 23, 2022

(87) PCT Pub. No.: WO2021/075124
PCT Pub. Date: Apr. 22, 2021

(65) Prior Publication Data
US 2022/0416760 A1 Dec. 29, 2022

(30) Foreign Application Priority Data
Oct. 16, 2019 (JP) ................................. 2019-189144

(51) Int. Cl.
*H03H 9/10* (2006.01)
*H03H 3/02* (2006.01)
(Continued)

(52) U.S. Cl.
CPC ............ *H03H 9/1035* (2013.01); *H03H 3/02* (2013.01); *H03H 9/0519* (2013.01); *H03H 9/19* (2013.01); *H03H 2003/022* (2013.01)

(58) Field of Classification Search
CPC ............................... H03H 9/1035; H03H 9/19
See application file for complete search history.

(56) References Cited

U.S. PATENT DOCUMENTS 6,251,507 B1 * 6/2001 Yamamoto .............. B32B 15/20
428/458
8,227,958 B2 7/2012 Inoue et al.
(Continued)

FOREIGN PATENT DOCUMENTS

JP 9-98049 A 4/1997
JP 11-136076 A 5/1999
(Continued)

OTHER PUBLICATIONS

English Translation of JP 2008205761 (Year: 2008).*
English Translation of JP 2014030126 (Year: 2014).*
Taiwan Office Action issued Jun. 7, 2024.

*Primary Examiner* — Bryan P Gordon
(74) *Attorney, Agent, or Firm* — Norris Mclaughlin, P.A.

(57) ABSTRACT

Metal films for first and second mounting terminals are formed at ends on both sides of a piezoelectric vibration plate across a vibrating portion, and first and second mounting terminals connected to these metal films are formed on outer surfaces of resin films adhered to the piezoelectric vibration plate. In case the metal films for first and second mounting terminals on both sides of the vibrating portion are desirably reduced in size in order to enlarge the vibrating portion, an adequate joining area for mounting purpose is still secured for the first and second mounting terminals formed on the outer surfaces of the resin films.

9 Claims, 16 Drawing Sheets

(51) Int. Cl.
    *H03H 9/05*        (2006.01)
    *H03H 9/19*        (2006.01)

(56)            References Cited

U.S. PATENT DOCUMENTS

| | | | |
|---|---|---|---|
| 2010/0244630 A1 | 9/2010 | Wada | |
| 2014/0252919 A1* | 9/2014 | Ariji ........................ | H03H 9/19 |
| | | | 310/344 |
| 2016/0226445 A1* | 8/2016 | Yamashita ............. | H03H 9/177 |
| 2017/0179922 A1* | 6/2017 | Nakamura ............. | H03H 9/172 |
| 2020/0169244 A1* | 5/2020 | Teramura ............. | H03H 9/0552 |
| 2022/0294392 A1* | 9/2022 | Matsuo ............... | H03H 9/0552 |

FOREIGN PATENT DOCUMENTS

| | | | |
|---|---|---|---|
| JP | 2000-103010 | A | 4/2000 |
| JP | 2005-184325 | A | 7/2005 |
| JP | 2006-339661 | A | 12/2006 |
| JP | 2008-205761 | A | 9/2008 |
| JP | 2010-187054 | A | 8/2010 |
| JP | 2011-82870 | A | 4/2011 |
| JP | 2012-195630 | A | 10/2012 |
| JP | 2014-30126 | A | 2/2014 |
| JP | 2017-212509 | A | 11/2017 |
| JP | 2018-32944 | A | 3/2018 |

* cited by examiner

F I G. 1
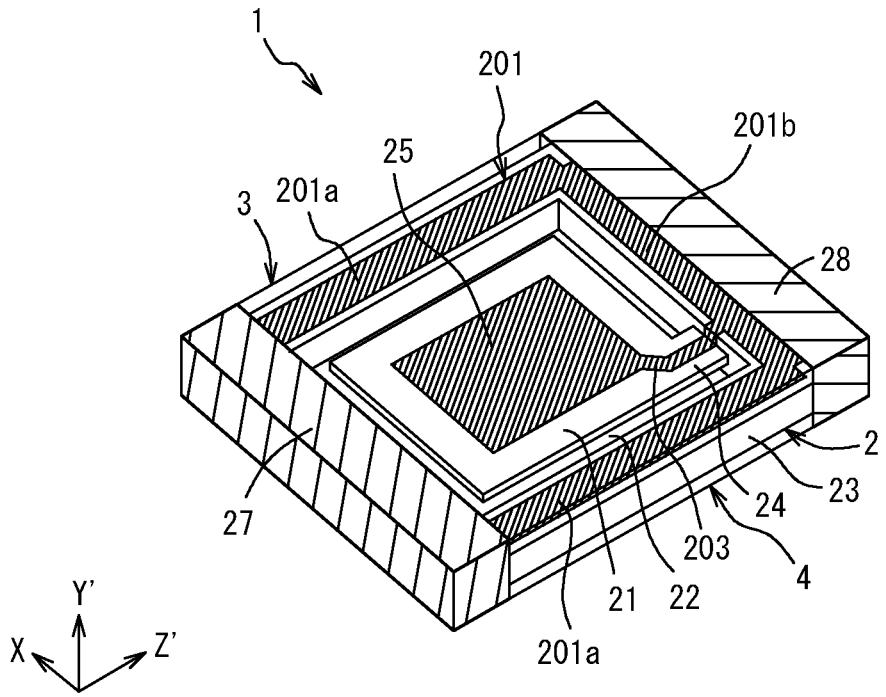
F I G. 2
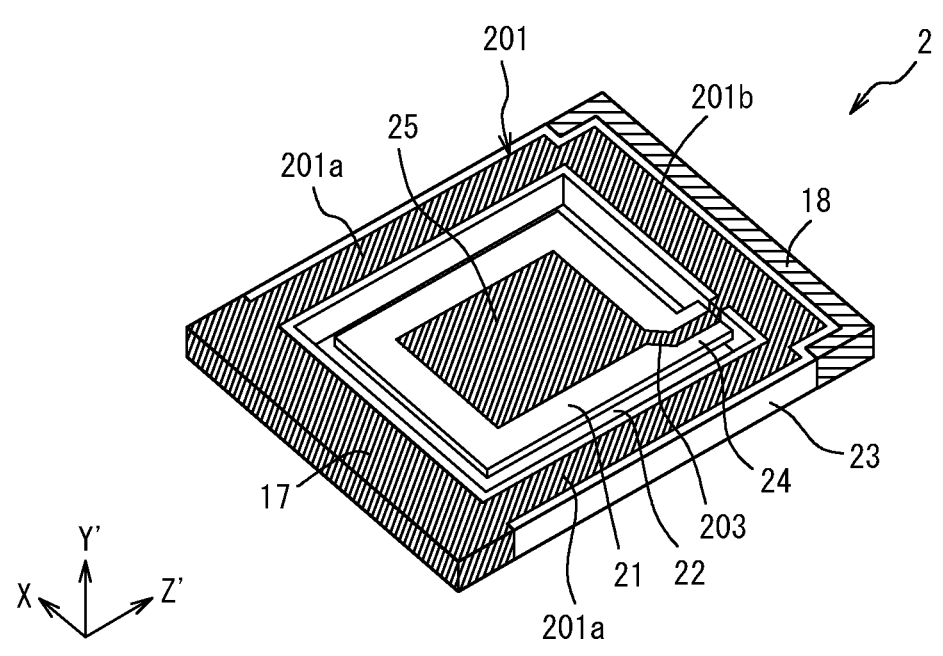

F I G. 3
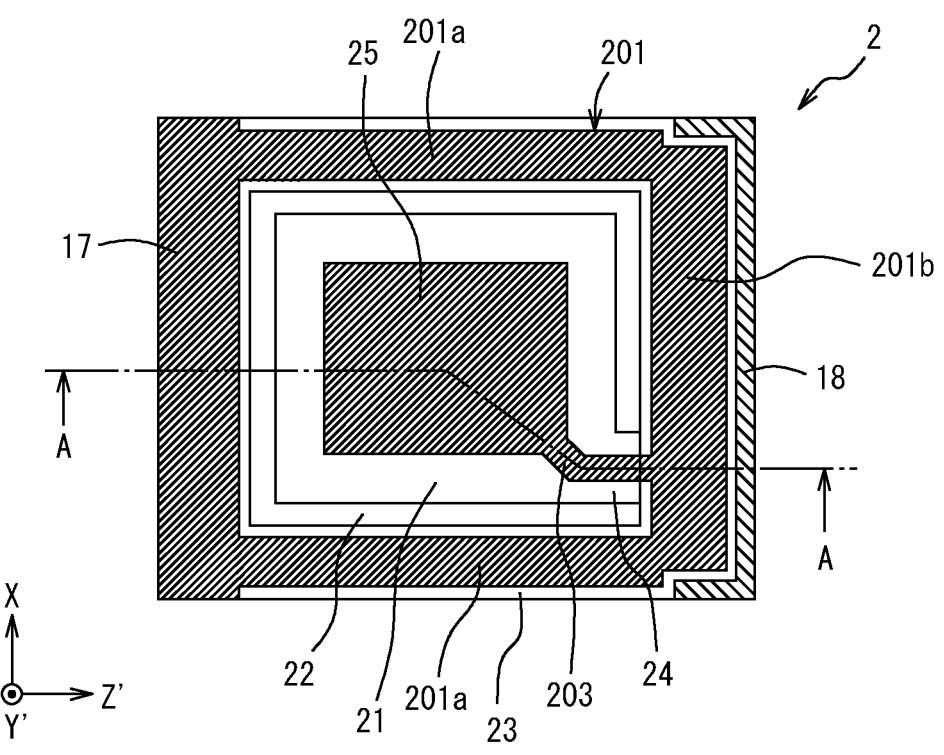
F I G. 4
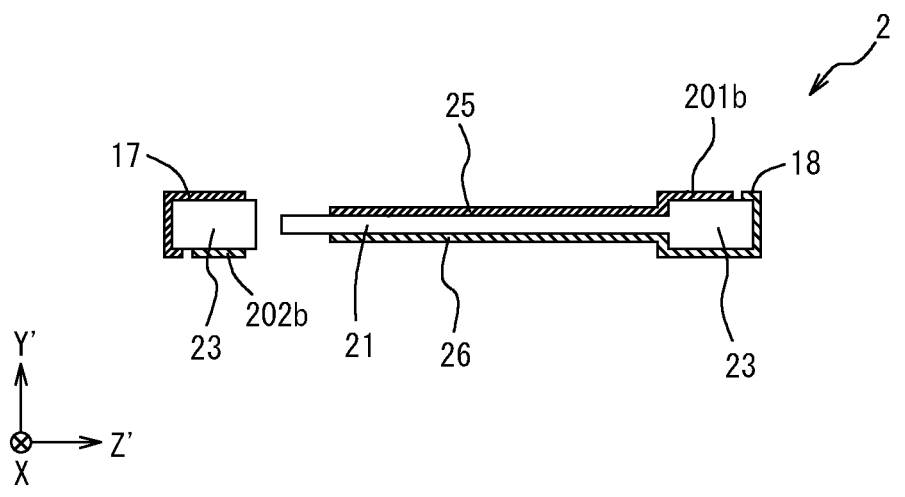

F I G.  7
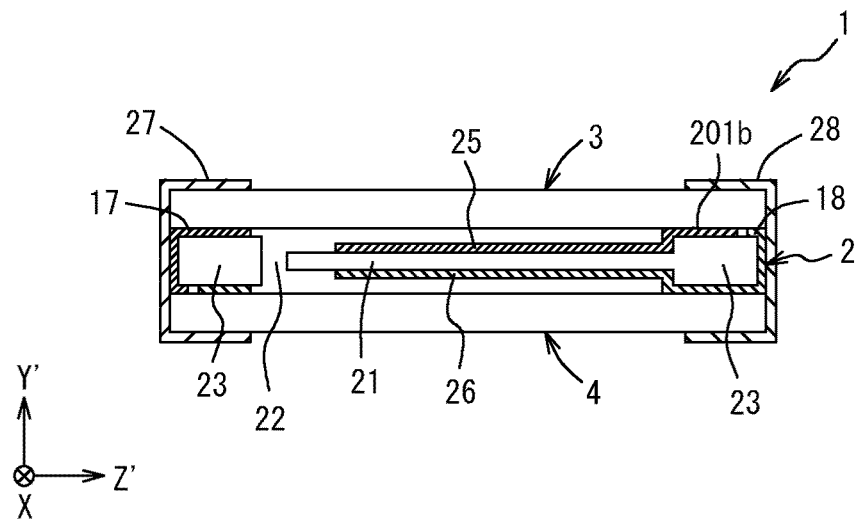
F I G.  8
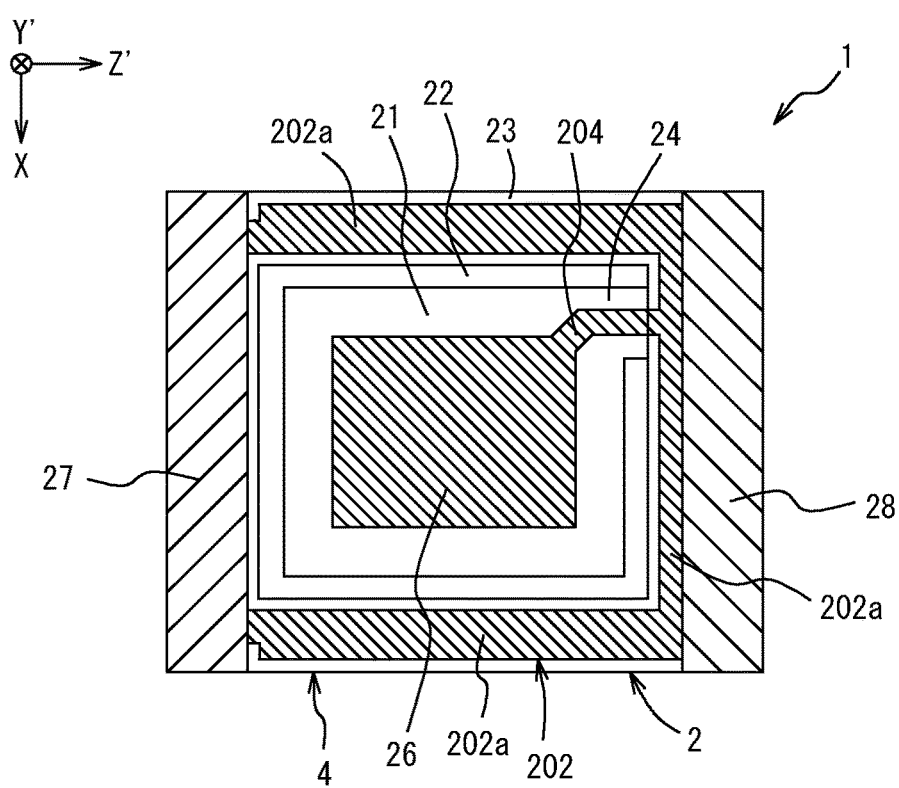

F I G.  9
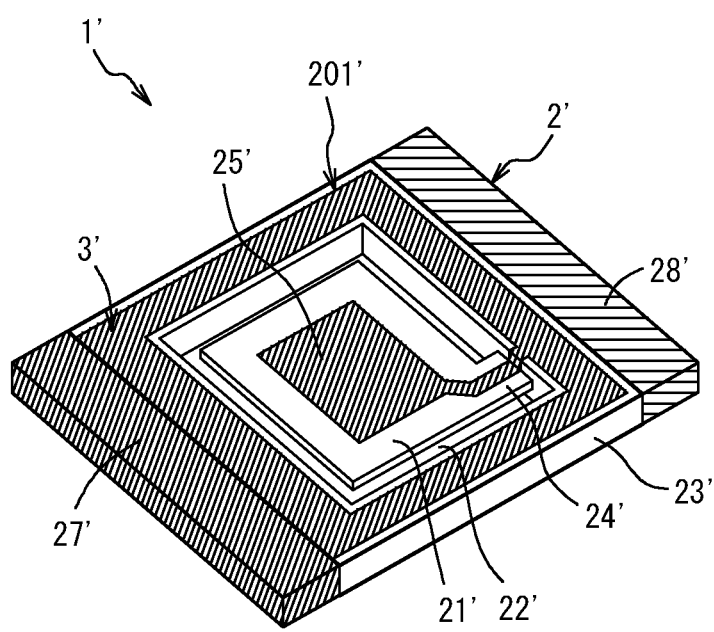
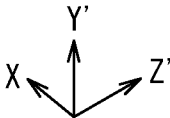

F I G. 1 0
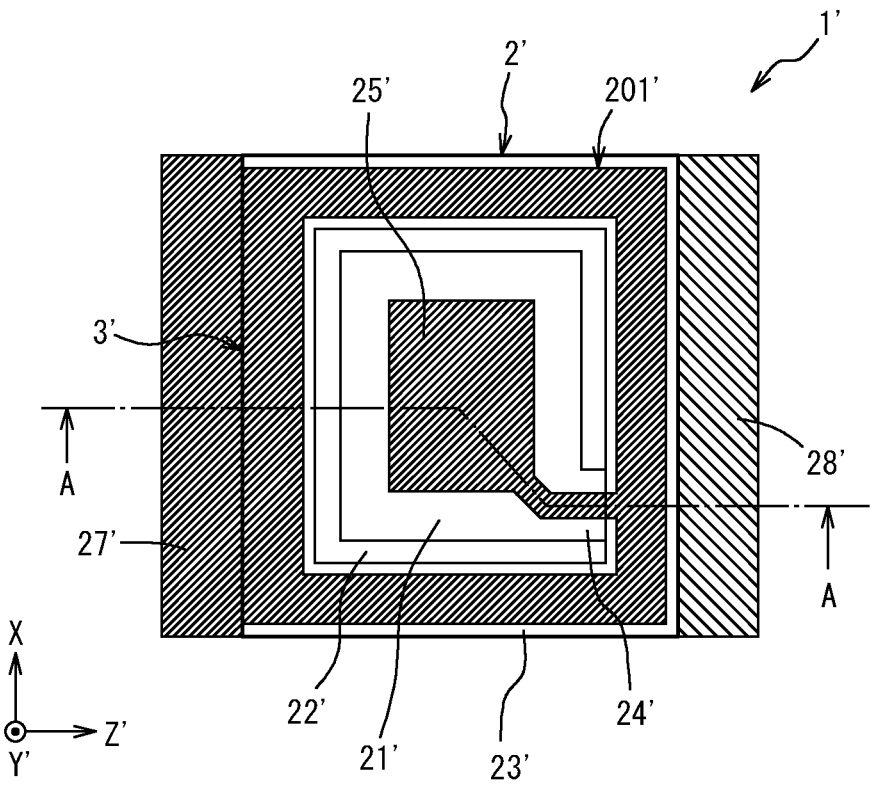
F I G. 1 1
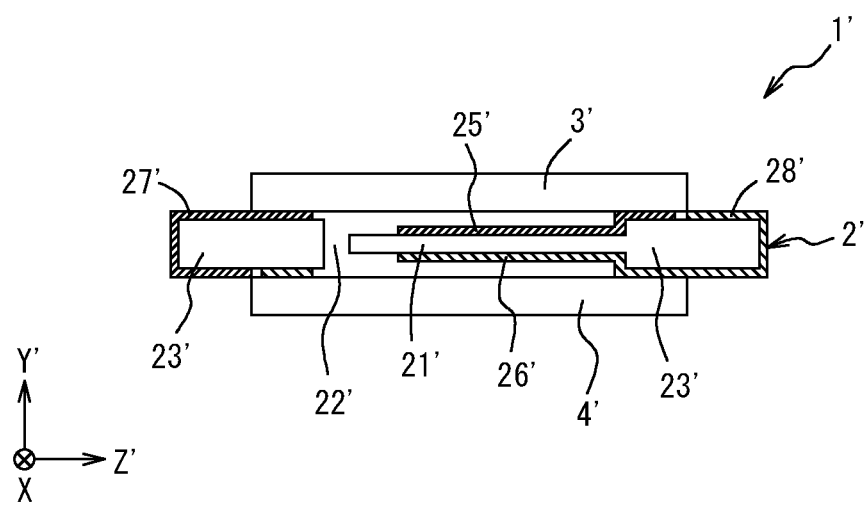

F I G. 1 3 A
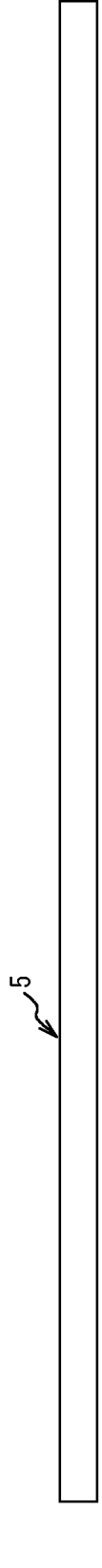
5
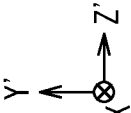

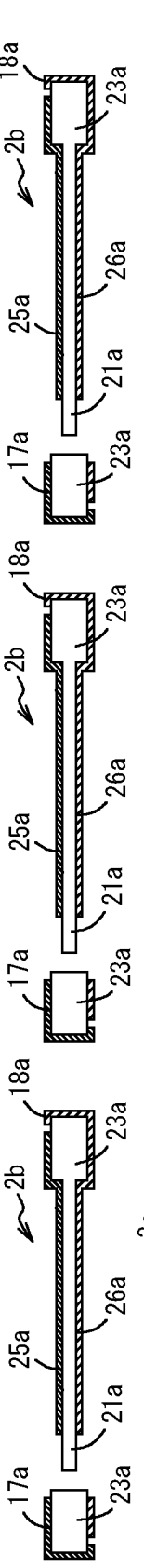
FIG. 13C
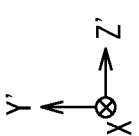

FIG. 13E
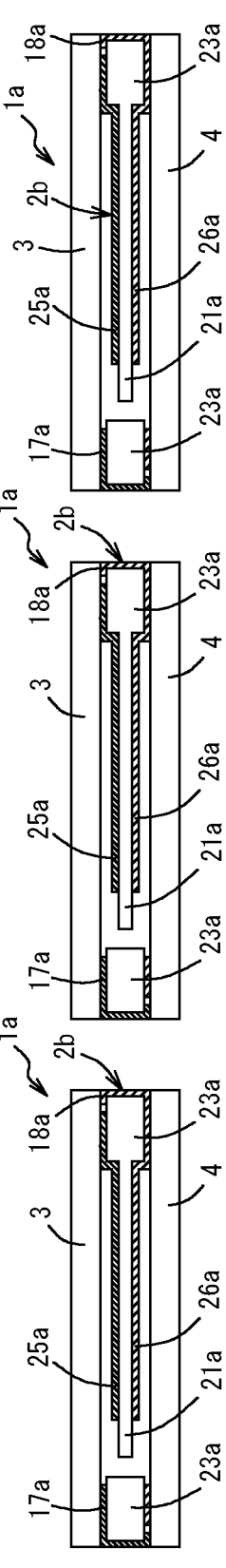
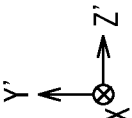

FIG. 13F
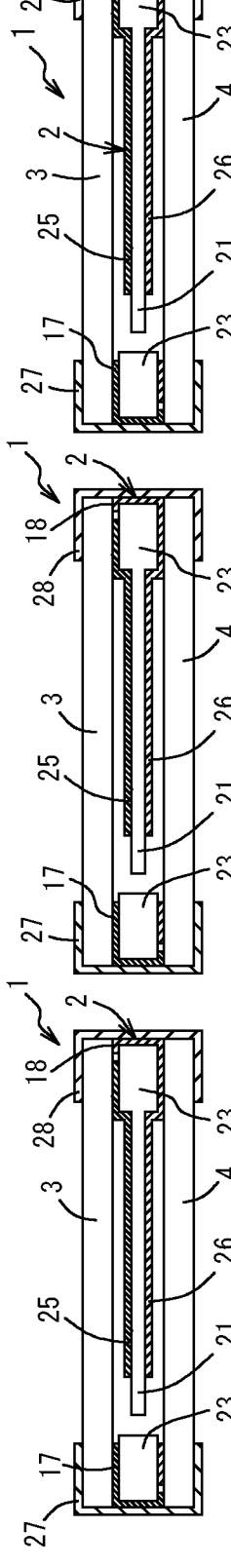
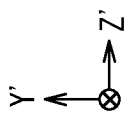

F I G .  1 4
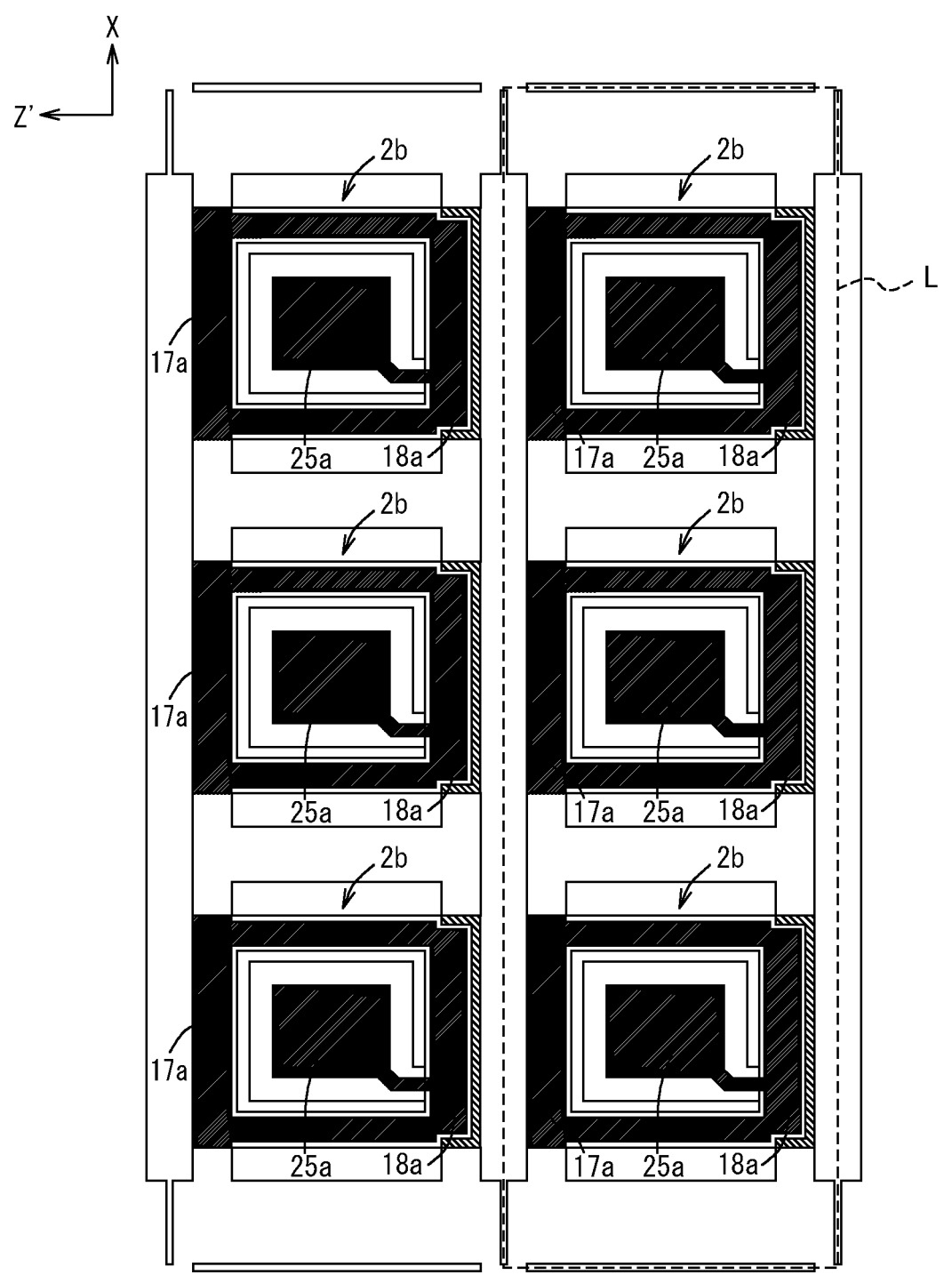

F I G .  1 5
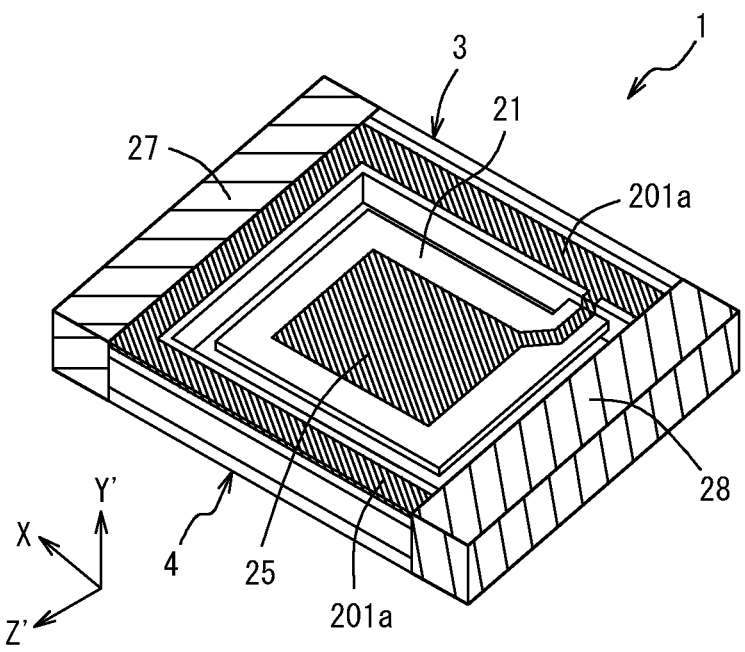
F I G .  1 6
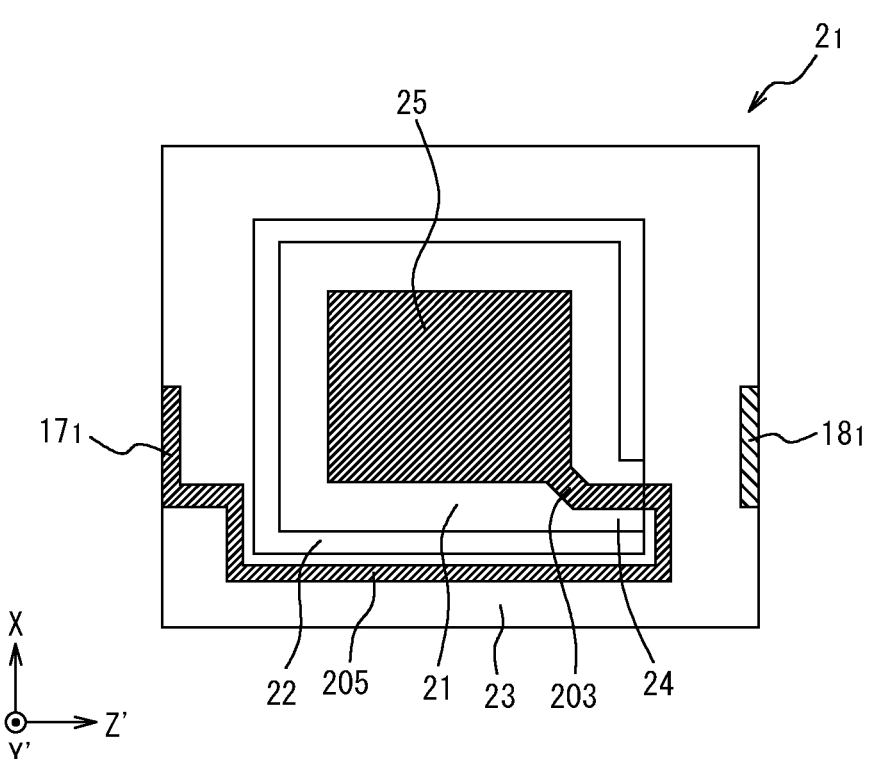

F I G. 1 7
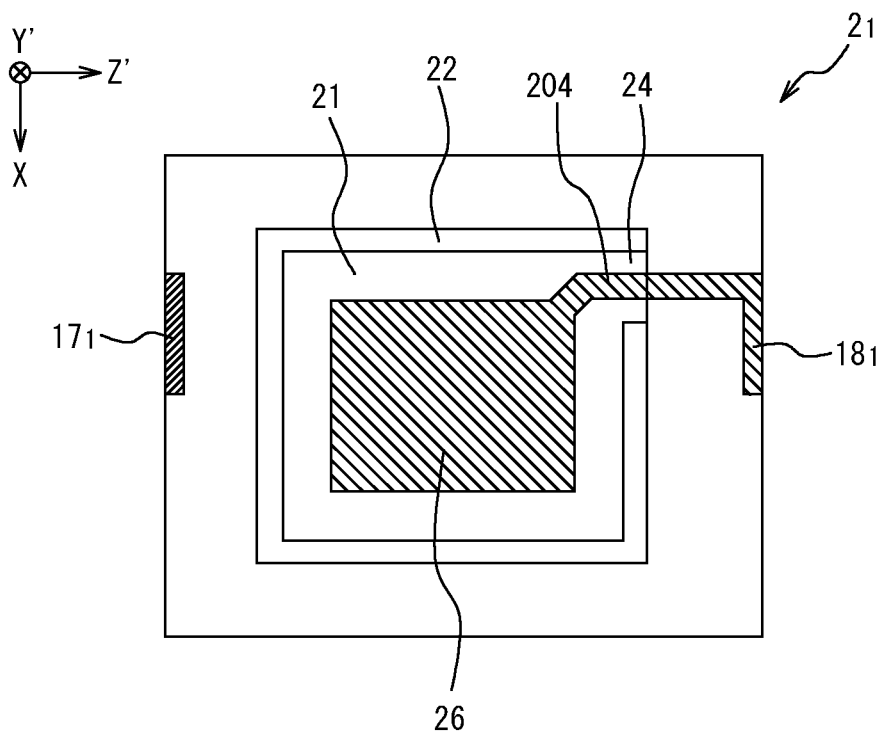
F I G. 1 8
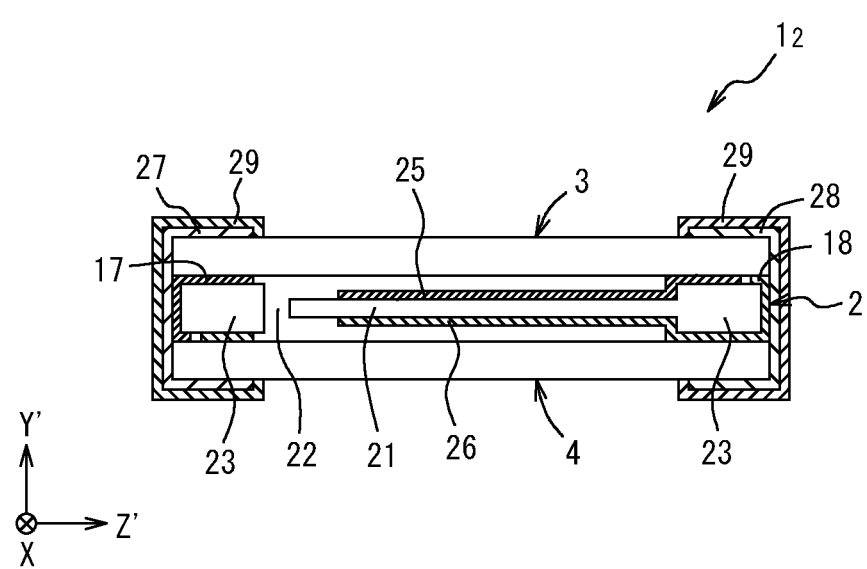

PIEZOELECTRIC VIBRATION DEVICE AND MANUFACTURING METHOD THEREFOR

TECHNICAL FIELD

This invention relates to a piezoelectric vibration device, examples of which may include piezoelectric vibrators, and a manufacturing method for the piezoelectric vibration device.

BACKGROUND ART

Surface-mounted crystal vibrators are typical examples of the piezoelectric vibration devices, examples of which may include piezoelectric vibrators. The surface-mounted crystal vibrators have so far been and are currently used very often in a broad range of applications. Patent literature 1 describes an example of such surface-mounted crystal vibrators. In the crystal vibrator of this example is used a ceramic-made, box-shaped base containing electrodes held therein and having an opening on its upper side. A crystal vibration piece is mounted on this base in the following manner; electrodes are led out from driving electrodes formed on surfaces on both sides of the crystal vibration piece, and these led-out electrodes are fixedly adhered, with an electrically conductive adhesive, to the electrodes of the base. Then, a lid member is firmly joined to the opening of the base mounted with the crystal vibration piece, so that the base is air-tightly sealed. On an outer bottom surface of the base are formed terminals used at the time of surface mounting of this crystal vibrator.

CITATION LIST

Patent Literature

Patent Literature 1: JP 2005-184325 A

SUMMARY OF INVENTION

Technical Problems

In most of the piezoelectric vibrators produced as described above, the package is so structured that a metal- or glass-made lid member is joined to a ceramic base. Such packages are often costly, which may inevitably lead to higher prices of the piezoelectric vibrators.

Further, it may be desirable to improve vibration characteristics of the piezoelectric vibrators without size enlargement.

To address these issues of the known art, this invention is directed to providing a piezoelectric vibration device inexpensively producible and improved in vibration characteristics without being enlarged in size.

Solutions to the Problems

To this end, this invention provides the following technical features.

1] A piezoelectric vibration device according to this invention includes a piezoelectric vibration plate, the piezoelectric vibration plate including a vibrating portion having a first driving electrode and a second driving electrode, and metal films for first and second mounting terminals, the metal films being respectively connected to the first driving electrode and the second driving electrode; and a first sealing member and a second sealing member adherable to main surfaces on both sides of the piezoelectric vibration plate in a manner that cover the first driving electrode and the second driving electrode formed on the main surfaces of the piezoelectric vibration plate.

The piezoelectric vibration device is further characterized in that:

at least one of the first sealing member or the second sealing member is a film including a resin;

the metal film for first mounting terminal is formed at one of ends on both sides of the piezoelectric vibration plate across the vibrating portion;

the metal film for second mounting terminal is formed at another one of the ends on both sides of the piezoelectric vibration plate across the vibrating portion;

ends on both sides of the film are adhered to the ends on both sides of the piezoelectric vibration plate across the vibrating portion;

a first mounting terminal connected to the metal film for first mounting terminal is formed in a manner that covers an outer surface of the film at one of the ends on the both sides thereof; and a second mounting terminal connected to the metal film for second mounting terminal is formed in a manner that covers the outer surface of the film at another one of the ends on the both sides thereof.

In the piezoelectric vibration device according to this invention, the metal films for first and second mounting terminals are connected to the first driving electrode and the second driving electrode of the vibrating portion, and these metal films are respectively formed at the both ends of the piezoelectric vibration plate across the vibrating portion, and the first mounting terminal and the second mounting terminal respectively connected to the metal films for first and second mounting terminals are formed in a manner that cover the outer surface of the resin-containing film constituting at least one of the first sealing member or the second sealing member adhered to the piezoelectric vibration plate.

In case the metal films for first and second mounting terminals formed across the vibrating portion are desirably reduced in size in order to enlarge the vibrating portion, the first and second mounting terminals may be formed on the outer surface of the film adhered to the piezoelectric vibration plate in an adequate size(s) required for mounting purpose.

Thus, the vibrating portion may be dimensionally increased for better vibration characteristics without having to enlarge the piezoelectric vibration device. Further advantageously, the first and second mounting terminals may be allowed to secure an adequate joining area required for mounting purpose of the piezoelectric vibration device.

Conventionally, piezoelectric vibration pieces may be each housed in a box-shaped base equipped with mounting terminals and having an opening on its upper side. In the piezoelectric vibration device described herein, however, the first and second mounting terminals respectively connected to the first and second driving electrodes are formed on the outer surface of the resin-containing film adhered to the piezoelectric vibration plate. This makes such a conventional means unnecessary, eliminating the need for high-priced bases.

The resin-containing film is adhered to at least one of the main surfaces of the piezoelectric vibration plate to seal at least one of the first driving electrode or the second driving electrode. This may conduce to lower production cost than use of a metal-made or glass-made lid for sealing.

2] In preferred embodiments of this invention, the piezo-electric vibration device may be characterized in that the first sealing member and the second sealing member are a first film and a second film including the resin, ends on both sides of the first film and of the second film are adhered to the ends on both sides of the piezoelectric vibration plate across the vibrating portion, the first mounting terminal connected to the metal film for first mounting terminal is formed in a manner that covers outer surfaces of the first film and of the second film at the ends on one of the both sides thereof, and the second mounting terminal connected to the metal film for second mounting terminal is formed in a manner that covers the outer surfaces of the first film and of the second film at the ends on another one of the both sides thereof.

According to these embodiments, of the ends on both sides of the first and second films respectively adhered to the main surfaces of the piezoelectric vibration plate, the first mounting terminal is formed in a manner that covers the outer surfaces of these films at the ends on one of the both sides, and the second mounting terminal is formed in a manner that covers the outer surfaces of these films at the ends on the other side. By having the first and second mounting terminals thus formed at the ends of the films adhered the main surfaces of the piezoelectric vibration plate, either one of the main surfaces of the piezoelectric vibration device may be used at the time of mounting this device to, for example, a circuit board.

The resin-containing first and second films are adhered to the main surfaces of the piezoelectric vibration plate to cover and seal the first and second driving electrodes. Thus, no ceramic-made, metal-made or glass-made lid may have to be used for sealing, conducing to further cost reduction.

3] In one embodiment of this invention, the piezoelectric vibration device may be characterized in that the first mounting terminal is formed in a manner that covers all of the outer surfaces of the first film and of the second film at the ends on one of the both sides thereof and that covers a whole outer surface of the piezoelectric vibration plate at one of the ends on the both sides thereof across the vibrating portion, and the second mounting terminal is formed in a manner that covers all of the outer surfaces of the first film and of the second film at the ends on another one of the both sides thereof and that covers the whole outer surface of the piezoelectric vibration plate at another one of the ends on the both sides thereof across the vibrating portion.

According to this embodiment, the first and second mounting terminals are formed in a manner that cover the entire outer surfaces of the first and second films and the entire surface of the piezoelectric vibration plate at the respective ends. When, for example, ends of the piezoelectric vibration plate having the first and second films being adhered thereto are immersed in an electrically conductive paste and the electrically conductive paste is then thermally cured, the first and second mounting terminals may be formed in a manner that cover the entire outer surface at the ends of the piezoelectric vibration plate having the first and second films being adhered thereto. Thus, the production cost may be favorably reduced, as compared with the first and second mounting terminals being formed by, for example, sputtering or vapor deposition.

4] In other embodiments of this invention, the piezoelectric vibration device may be characterized in that the piezoelectric vibration plate further includes an outer frame coupled to the vibrating portion through a coupling means, the outer frame surrounds, at a position spaced from the vibrating portion, an outer circumference of the vibrating portion smaller in thickness, the metal films for first and second mounting terminals are formed on the outer frame, and the first film and the second film are adhered to the outer frame in a manner that seal the first driving electrode and the second driving electrode.

According to these embodiments, circumferential ends of the first and second films are adhered to the outer frame surrounding the outer circumference of the vibrating portion. Thus, the vibrating portion may be successfully sealed without any contact of the first film or the second film with the vibrating portion thinner than the outer frame.

5] In one embodiment of this invention, the piezoelectric vibration device may be characterized in that the metal films for first and second mounting terminals are formed on an end surface and main surfaces on both sides of the outer frame, and the first film and the second film are joined to the metal films for first and second mounting terminals formed on the main surfaces of the outer frame.

According to this embodiment, the metal films for first and second mounting terminals are formed on the end surface of the outer frame, as well as on the main surfaces of the outer frame, of the first, second film-adhered piezoelectric vibration plate. Thus, the metal films for first and second mounting terminals on the end surface may be electrically connected to the first and second mounting terminals. The first and second films, which are joined to the metal films for first and second mounting terminals formed on the main surfaces of the outer frame, may be adherable with a better adhesive strength than being adhered to the outer frame of the piezoelectric vibration plate.

6] In other embodiments of this invention, the piezoelectric vibration device may be characterized in that one of the main surfaces on both sides of the outer frame has a first sealing pattern to which the first film is adherable, the first sealing pattern being connected to the metal film for first mounting terminal and surrounding the vibrating portion with the metal film for first mounting terminal, and another one of main surfaces the outer frame has a second sealing pattern to which the second film is adherable, the second sealing pattern being connected to the metal film for second mounting terminal and surrounding the vibrating portion with the metal film for second mounting terminal.

According to these embodiments, the first and second sealing patterns, to which the first and second films are adherable and which are formed on the main surfaces of the outer frame, surround the vibrating portion with the metal films for first and second mounting terminals. Then, the vibrating portion may be reliably sealed as a result of firm adhesion of circumferential ends of the first and second films to the first and second sealing patterns and the metal films for first and second mounting terminals surrounding the vibrating portion.

7] In other embodiments of this invention, the first mounting terminal and the second mounting terminal may be formed by curing an electrically conductive paste.

According to these embodiments, both ends of the piezoelectric vibration plate, to which the sealing members, i.e., films, have been adhered, are immersed in an electrically conductive paste and the electrically conductive paste is then thermally cured to form the first and second mounting terminals. Thus, the production cost may be favorably reduced, as compared with the first and second mounting terminals being formed by, for example, sputtering or vapor deposition.

8] In other embodiments of this invention, the film or the first and second films may be a film including a heat-resistant resin.

According to these embodiments, the films used to cover and seal the driving electrodes of the piezoelectric vibration plate are made of a heat-resistant resin. This may avoid the risk of film deformation during reflow soldering performed to produce the piezoelectric vibration device.

9] In one embodiment of this invention, the film or the first and second films may include, on at least one surface thereof, a thermoplastic adhesive layer.

According to this embodiment, when one surface of the film with a thermoplastic adhesive layer formed thereon is pressed under heat onto the piezoelectric vibration plate, the film may be adhered well to the piezoelectric vibration plate.

10] In other embodiments of this invention, the piezoelectric vibration plate may be a crystal vibration plate.

According to these embodiments, use of a crystal vibration plate as the piezoelectric vibration plate may provide a piezoelectric vibration device that excels in frequency-temperature characteristics.

11] A manufacturing method for a piezoelectric vibration device according to this invention includes preparing a piezoelectric wafer in order to provide a piezoelectric vibration plate, the piezoelectric vibration plate including:

a vibrating portion having a first driving electrode and a second driving electrode; and metal films for first and second mounting terminals, the metal films being respectively connected to the first driving electrode and the second driving electrode, the manufacturing method further including:

an external shape forming step of forming external shapes of a plurality of the piezoelectric substrates on the piezoelectric wafer;

a piezoelectric vibration plate forming step of forming the first driving electrode and the second driving electrode on main surfaces on both sides of the plurality of the piezoelectric substrates, the piezoelectric vibration plate forming step further forming, on the piezoelectric substrate, the metal films for first and second mounting terminals to be connected to the first driving electrode and the second driving electrode, thus obtaining the piezoelectric vibration plate;

an adhering step of adhering a first sealing member and a second sealing member to the main surfaces of a plurality of the piezoelectric vibration plates in a manner that cover the first driving electrode and the second driving electrode formed on the main surfaces earlier in the piezoelectric vibration plate forming step, the adhering step using a film including a resin as at least one of the first sealing member or the second sealing member;

a dividing step of dividing, along one direction, the plurality of the piezoelectric vibration plates to which the first and second sealing members are adhered earlier in the adhering step;

a mounting terminal forming step of immersing, in an electrically conductive paste, ends on both sides of the plurality of the piezoelectric vibration plates divided earlier in the dividing step to form a first mounting terminal and a second mounting that are respectively connected to the metal films for first and second mounting terminals; and a separating step of separating, into individual pieces, the plurality of the piezoelectric vibration plates mounted with the first mounting terminal and the second mounting terminal formed earlier in the mounting terminal forming step.

The manufacturing method is further characterized in that:

in the piezoelectric vibration plate forming step, the metal film for first mounting terminal is formed at one of ends on both sides of the piezoelectric vibration plate across the vibrating portion, and the metal film for second mounting terminal is formed at another one of the ends on both sides of the piezoelectric vibration plate across the vibrating portion;

in the adhering step, ends on both sides of the film are adhered to the ends on both sides of the piezoelectric vibration plate across the vibrating portion; and in the mounting terminal forming step, the first mounting terminal is formed in a manner that covers an outer surface of the film at one of the ends on the both sides thereof and an outer surface at one of the ends on both sides of the piezoelectric vibration plate across the vibrating portion, and the second mounting terminal is formed in a manner that covers the outer surface of the film at another one of the ends on the both sides thereof and the outer surface of the piezoelectric vibration plate at another one of the ends on the both sides thereof across the vibrating portion.

The manufacturing method for the piezoelectric vibration device according to this invention is characterized as below; in the piezoelectric vibration plate forming step, the metal films for first and second mounting terminals respectively connected to the first and second driving electrodes are formed at the ends on both sides of the piezoelectric substrate across the vibrating portion, and in the adhering step, the first and second mounting terminals respectively connected to the metal films for first and second mounting terminals are formed in a manner that cover the outer surface of the piezoelectric vibration plate at the ends on both sides thereof and the outer surface of the film at the ends on both sides thereof after the film is adhered to at least one of the main surfaces of the piezoelectric vibration plate. In case the metal films for first and second mounting terminals formed across the vibrating portion are desirably reduced in size in order to enlarge the vibrating portion, the first and second mounting terminals formed on the outer surface of the film adhered to the piezoelectric vibration plate may be allowed to have an adequate size(s) necessary for production of the piezoelectric vibration device.

Thus, the vibrating portion may be increased in size for better vibration characteristics without having to enlarge the piezoelectric vibration device. Further advantageously, the first and second mounting terminals may be allowed to secure an adequate joining area required for mounting purpose of the piezoelectric vibration device.

Conventionally, piezoelectric vibration pieces may be each housed in a box-shaped base equipped with mounting terminals and having an opening on its upper side. In the piezoelectric vibration device described herein, however, the first and second mounting terminals respectively connected to the first and second driving electrodes are formed on the outer surface of the resin-containing film adhered to the piezoelectric vibration plate. This makes such a conventional means unnecessary, eliminating the need for high-priced bases.

The resin-containing film is adhered to at least one of the main surfaces of the piezoelectric vibration plate to seal at least one of the first driving electrode or the second driving electrode. This may conduce to lower production cost than use of a metal-made or glass-made lid for sealing.

The matrix-like piezoelectric vibration plates on the unprocessed and uncut wafer are divided in one direction, for example, column-wise, which may allow column-wise handling of the piezoelectric vibrators. In the mounting terminal forming step, therefore, the first and second mounting terminals connected to the metal films for first and second mounting terminals may be formed by immersing the both ends of the film-adhered piezoelectric vibration plates in an electrically conductive paste. Thus, the production cost may be favorably reduced, as compared with the first and second mounting terminals being formed by, for example, sputtering or vapor deposition.

In preferred embodiments of this invention, the manufacturing method may be characterized as below; in the adhering step, the first sealing member and the second sealing member are a first film and a second film including the resin, and ends on both sides of the first film and of the second film are adhered to the ends on both sides of the piezoelectric vibration plate across the vibrating portion, and in the mounting terminal forming step, the first mounting terminal is formed in a manner that covers outer surfaces of the first film and of the second film at the ends on one of the both sides thereof and that covers an outer surface of the piezoelectric vibration plate at one of the ends on the both sides thereof across the vibrating portion, and the second mounting terminal is formed in a manner that covers the outer surfaces of the first film and of the second film at the ends on another one of the both sides thereof and that covers the outer surface of the piezoelectric vibration plate at another one of the ends on the both sides thereof across the vibrating portion.

According to these embodiments, the first and second mounting terminals are formed in a manner that cover the both ends of the first and second films adhered to the main surfaces of the piezoelectric vibration plate, i.e., the first and second mounting terminals are formed on the outer surfaces of the first and second films on the front and back sides. Thus, either one of the front and back surfaces may be used at the time of the piezoelectric vibration device being mounted to, for example, a circuit board.

The resin-containing first and second films are adhered to the main surfaces of the piezoelectric vibration plate to cover and seal the first and second driving electrodes. Thus, no ceramic-made, metal-made or glass-made lid may have to be used for sealing, conducing to further cost reduction.

Effects of the Invention

In the piezoelectric vibration device according to this invention, the first and second mounting terminals are respectively connected to the metal films for first and second mounting terminals formed at the both ends of the piezoelectric vibration plate across the vibrating portion, and these first and second mounting terminals are formed in a manner that cover the outer surfaces of the resin-containing film constituting at least one of the first sealing member or the second sealing member adhered to the piezoelectric vibration plate. In case the metal films for first and second mounting terminals formed across the vibrating portion are desirably reduced in size in order to enlarge the vibrating portion, the first and second mounting terminals formed on the outer surface of the film adhered to the piezoelectric vibration plate may be allowed to have an adequate size(s) necessary for production of the piezoelectric vibration device.

Thus, the vibrating portion may be increased in size for better vibration characteristics without having to enlarge the piezoelectric vibration device. Further advantageously, the first and second mounting terminals may be allowed to secure an adequate joining area required for mounting purpose of the piezoelectric vibration device.

Conventionally, piezoelectric vibration pieces may be each housed in a box-shaped base equipped with mounting terminals and having an opening on its upper side. In the piezoelectric vibration device described herein, however, the first and second mounting terminals that are respectively connected to the first and second driving electrodes are formed on the outer surface of the resin-containing film adhered to the piezoelectric vibration plate. This makes such a conventional means unnecessary, eliminating the need for high-priced bases.

The resin-containing film is adhered to at least one of the main surfaces of the piezoelectric vibration plate to seal at least one of the first driving electrode or the second driving electrode. This may conduce to lower production cost than use of a metal-made or glass-made lid for sealing.

BRIEF DESCRIPTION OF THE DRAWINGS

FIG. 1 is a schematic perspective view of a crystal vibrator according to an embodiment of this invention.

FIG. 2 is a schematic perspective view of a crystal vibration plate constituting the crystal vibrator illustrated in FIG. 1.

FIG. 3 is a schematic plan view of the crystal vibration plate illustrated in FIG. 2.

FIG. 4 is a schematic view in cross section of the crystal vibration plate along A-A line illustrated in FIG. 3.

FIG. 7 is a schematic view in cross section of the crystal vibrator along B-B line illustrated in FIG. 6.

FIG. 8 is a schematic bottom view of the crystal vibrator illustrated in FIG. 1.

FIG. 9 is a schematic perspective view of another example of the crystal vibrator according to this invention.

FIG. 10 is a schematic plan view of the crystal vibrator illustrated in FIG. 9.

FIG. 11 is a schematic view in cross section of the crystal vibrator along A-A line illustrated in FIG. 10.

FIG. 13A is a schematic view in cross section of steps of manufacturing the crystal vibrator illustrated in FIG. 1.

FIG. 13C is a schematic view in cross section of steps of manufacturing the crystal vibrator illustrated in FIG. 1.

FIG. 13E is a schematic view in cross section of steps of manufacturing the crystal vibrator illustrated in FIG. 1.

FIG. 13F is a schematic view in cross section of steps of manufacturing the crystal vibrator illustrated in FIG. 1.

FIG. 14 is a plan view illustrated to describe a dividing step.

FIG. 15 is a schematic perspective view of a crystal vibrator according to another embodiment of this invention.

FIG. 16 is a schematic plan view of a crystal vibration plate constituting a crystal vibrator according to yet another embodiment of this invention.

FIG. 17 is a schematic bottom view of the crystal vibration plate illustrated in FIG. 16.

FIG. 18 is a schematic in cross section of the crystal vibrator according to the yet another embodiment illustrated correspondingly to FIG. 7.

DESCRIPTION OF THE EMBODIMENTS

Figure 5:
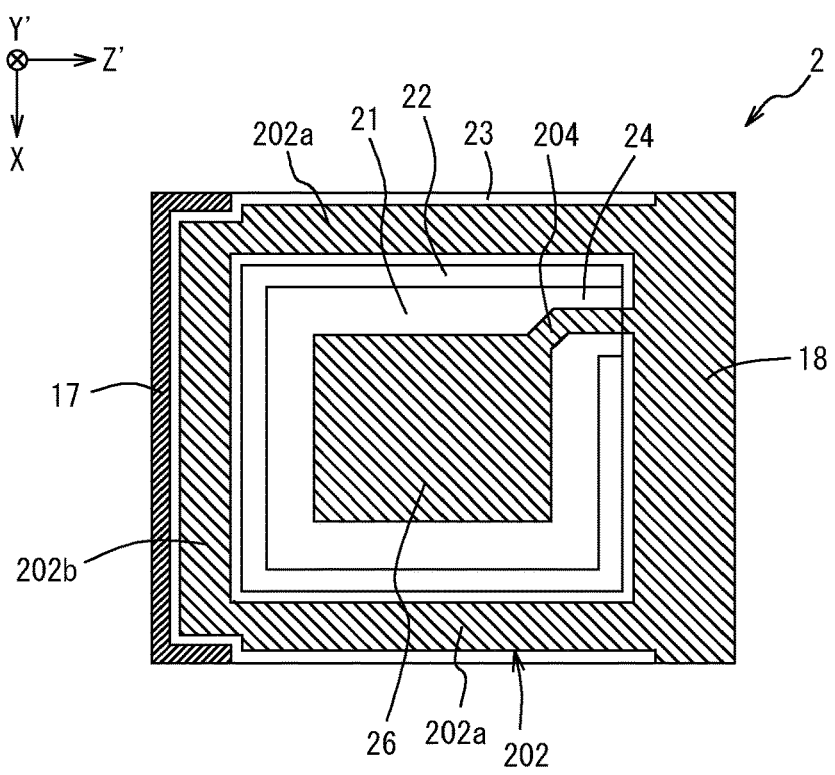
FIG. 5 is a schematic bottom view of the crystal vibration plate illustrated in FIG. 2.

An embodiment of this invention is hereinafter described in detail referring to the accompanying drawings. In the description of this embodiment, a crystal vibrator is used as an example of the crystal vibration device.

FIG. 1 is a schematic perspective view of a crystal vibrator according to an embodiment of this invention.

A crystal vibrator 1 according to this embodiment includes an AT-cut crystal vibration plate 2, a first resin film 3; an example of the first sealing member, and a second resin film 4; an example of the second sealing member. The first and second resin films 3 and 4 are adhered to the whole main surfaces of the crystal vibration plate 2. The first and second resin films 3 and 4 are transparent films.

First, the crystal vibration plate 2; a component of the crystal vibrator 1, is hereinafter described.

FIG. 2 is a schematic perspective view of the crystal vibration plate 2. FIG. 3 is a schematic plan view of the crystal vibration plate 2. FIG. 4 is a schematic view in cross section of the crystal vibration plate 2. FIG. 5 is a schematic bottom view of the crystal vibration plate 2.

The crystal vibration plate 2 according to this embodiment is an AT-cut crystal plate obtained by processing a crystal plate through 35°15' rotation around X axis which is a crystal axis, in which new axes after the rotation are respectively Y' axis and Z' axis. In this AT-cut crystal plate, front and back main surfaces are XZ' planes. In the XZ' plane, the X-axis direction refers to a direction along short sides of the rectangular crystal vibration plate 2 rectangular in plan view, and the Z'-axis direction refers to a direction along long sides of the rectangular crystal vibration plate 2.

The crystal vibration plate 2 includes a vibrating portion 21, an outer frame 23, and a coupling portion 24. The vibrating portion 21 is substantially rectangular in plan view. The outer frame 23 surrounds the vibrating portion 21 with a penetrating portion 22 being interposed therebetween. The coupling portion 24 couples the vibrating portion 21 to the outer frame 23. The vibrating portion 21, outer frame 23 and coupling portion 24 are formed as an integral unit. The vibrating portion 21 and the coupling portion 24 are formed to be smaller in thickness than the outer frame 23. Thus, the vibrating portion is thinner than the outer frame 23.

A pair of first and second driving electrodes 25 and 26 are respectively formed on a front main surface and on a back main surface of the vibrating portion 21. On the outer frame 23 at both ends in the long-side direction of the crystal vibration plate 2 rectangular in plan view are formed metal films for first and second mounting terminals along the short-side direction of the crystal vibration plate 2. These metal films are respectively electrically connected to the first and second driving electrodes 25 and 26. The metal films for first and second mounting terminals 17 and 18 are formed at ends on both sides of the crystal vibration plate 2 in the long-side direction across the vibrating portion 21.

The ends on both sides in the long-side direction of the crystal vibration plate 2, described earlier, may specifically refer to parts at one end and at the other end of the crystal vibration plate 2, each having a dimension from the one end or the other end of one-quarter of the length of the crystal vibration plate 2 in the long-side direction. Preferably, these two ends in the long-side direction of the crystal vibration plate 2 may refer to parts at one end and at the other end of the crystal vibration plate 2, each having a dimension from the one end or the other end of one-sixth of the length of the crystal vibration plate 2 in the long-side direction. The metal films 17 and 18 for first and second mounting terminals may preferably be formed in at least part of these end parts.

In the first and second resin films 3 and 4 respectively adhered to the main surfaces of the crystal vibration plate 2, ends on both sides of these films are adhered to the both ends of the crystal vibration plate 2 in the long-side direction.

As illustrated in FIG. 3, the metal film 17 for first mounting terminal on one of the main surfaces of the crystal vibration plate 2 is continuous to a first sealing pattern 201 described later, and this metal film 17 has a greater dimension in the direction of width (lateral direction on FIG. 3) than the metal film 18 for second mounting terminal.

The metal film 18 for second mounting terminal smaller in width (in the lateral direction on FIG. 3) than the metal film 17 for first mounting terminal extends along a peripheral edge on one of the short sides (on the right side on FIG. 3) of the crystal vibration plate 2 rectangular in plan view. Ends of this metal film 18 extending along the short side are so bent that follow peripheral edges in part on the opposing long sides of the rectangular shape. The metal film 18 for second mounting terminal is formed in a manner that surrounds a second extended portion 201*b* of the first sealing pattern 201 described later.

As illustrated in FIG. 5, the metal film 18 for second mounting terminal on the other one of the main surfaces of the crystal vibration plate 2 is continuous to a second sealing pattern 202 described later, and this metal film 18 has a greater dimension in the direction of width (lateral direction on FIG. 5) than the metal film 17 for second mounting terminal.

The metal film 17 for second mounting terminal smaller in width (in the lateral direction on FIG. 5) than the metal film 18 for first mounting terminal extends along a peripheral edge on the other one of the short sides of the crystal vibration plate 2 rectangular in plan view. Ends of this metal film 17 extending along the short side are so bent that follow peripheral edges in part on the opposing long sides of the rectangular shape. The metal film 17 for second mounting terminal is formed in a manner that surrounds a second extended portion 202*b* of the second sealing pattern 202 described later.

The metal films 17 and 18 for first and second mounting terminals of the crystal vibration plate 2 are formed on the main surfaces of the crystal vibration plate 2 and on the end surfaces on the opposing long sides and on the opposing short sides of the crystal vibration plate 2.

As described later, these metal films 17 and 18 for first and second mounting terminals are electrically connected to the first and second mounting terminals 27 and 28 formed at both ends on the outer surface in the long-side direction of the crystal vibrator 1 of FIG. 1 rectangular in plan view. The first and second mounting terminals 27 and 28 are used to mount the crystal vibrator 1 to, for example, a circuit board.

In this embodiment, the vibrating portion 21 substantially rectangular in plan view is coupled to the outer frame 23 through the coupling portion 24 formed at one position; one corner, of the rectangular shape. This may reduce a stress possibly acted upon the vibrating portion 21, as compared with this portion being coupled to the outer frame at two or more positions.

In this embodiment, the coupling portion 24 protrudes from one side in the X-axis direction of an inner circumference of the outer frame 23 and then extends in the Z'-axis direction. The crystal vibration plate 2 has, at its both ends in the Z'-axis direction, first and second mounting terminals 27 and 28, and these mounting terminals 27 and 28 are directly joined to, for example, a circuit board with a solder. As a result of these structural features, a contraction stress may possibly be generated in the long-side direction of the crystal vibrator (Z'-axis direction) and transmitted to the vibrating portion, in which case the crystal vibrator's oscillation frequency may be easily variable.

In this embodiment, however, the coupling portion 24 is formed in a direction in which the contraction stress is transmittable, and the contraction stress may be thus difficult to transmit to the vibrating portion 21. This may control possible variability of the oscillation frequency at the time of mounting the crystal vibrator 1 to a circuit board.

A first sealing pattern 201 is formed on one of the main surfaces of the crystal vibration plate 2 to which the first resin film 3 is adhered. The first sealing pattern 201 is formed in a rectangular frame-like shape, like the metal film 17 for first mounting terminal, in a manner that surrounds the substantially rectangular vibrating portion 21. The first sealing pattern 201 includes first extended portions 201*a* and a second extended portion 201*b*. The first extended portions 201*a* are continuous to the metal film 17 for first mounting terminal and both extend in the long-side direction of the crystal vibration plate 2 (Z'-axis direction). The second extended portion 201*b* extends in the short-side direction of the crystal vibration plate 2 (X-axis direction) and serves to connect ends of extension of the first extended portions 201*a*. On the outer peripheral side of junction between the first extended portions 201*a* and the second extended portion 201*b* is provided an interval to keep a certain space from the metal film 18 for second mounting terminal extending along peripheral edges in part of the opposing long sides of the crystal vibration plate 2. The second extended portion 201*b* are connected to a first extraction electrode 203 extracted from a first driving electrode 25.

The metal film 17 for first mounting terminal at one of the both ends in the long-side direction of the crystal vibration plate 2 is, therefore, electrically connected to the first driving electrode 25 through the first extraction electrode 203 and the first sealing pattern 201.

The metal film 17 for first mounting terminal greater in width than the metal film 18 for second mounting terminal is formed on one of the main surfaces of the crystal vibration plate 2 to which the first resin film 3 is adhered. The metal film 17 for first mounting terminal, like the first sealing pattern 201, is formed in a rectangular frame-like shape in a manner that surrounds the vibrating portion 21. This may promise firm adhesion of the first resin film 3 to this rectangular region.

The metal film 18 for second mounting terminal is formed along a peripheral edge on one of the short sides (right side on FIG. 3) and peripheral edges in part of the opposing long sides of the crystal vibration plate 2 rectangular in plan view. This metal film 18 is formed in a manner that surrounds the second extended portion 201*b* of the first sealing pattern 201. This may ensure that the first resin film 3 is firmly bonded to the peripheral edge on the short side and to the peripheral edges in part of the opposing long sides. When one end on the short side of the crystal vibration plate 2 having the first resin film 3 being adhered thereto is immersed in an electrically conductive paste, as described later, the electrically conductive paste may be successfully blocked by the metal film 18 for second mounting terminal and thereby prevented from advancing into the second extended portion 201*b* of the first sealing pattern 201.

There is an electrode-less region; region where no electrode is formed, between the metal film 18 for second mounting terminal and the second extended portion 201*b* extending along the short-side direction of the crystal vibration plate 2. This electrode-less region is formed to ensure electrical insulation between the first sealing pattern 201 and the metal film 18 for second mounting terminal.

A second sealing pattern 202 is formed on the other one of the main surfaces of the crystal vibration plate 2 to which the second resin film 4 is adhered. The second sealing pattern 202, like the metal film 18 for second mounting terminal, is formed in a rectangular frame-like shape in a manner that surrounds the substantially rectangular vibrating portion 21. The second sealing pattern 202 includes first extended portions 202*a* and a second extended portion 202*b*. The first extended portions 202*a* are continuous to the metal film 18 for second mounting terminal and both extend in the long-side direction of the crystal vibration plate 2. The second extended portion 201*b* extends in the short-side direction of the crystal vibration plate 2 and serves to connect ends of extension of the second extended portions 202*a*. On the outer peripheral side of junction between the second extended portions 202*a* and the second extended portion 202*b* is provided an interval to keep a certain space from the metal film 17 for first mounting terminal extending along peripheral edges in part of the opposing long sides of the crystal vibration plate 2.

The metal film 18 for second mounting terminal at the other one of the both ends in the long-side direction of the crystal vibration plate 2 is, therefore, electrically connected to a second extraction electrode 204 extracted from a second driving electrode 26, i.e., the metal film 18 for second mounting terminal is electrically connected to the second driving electrode 26.

The metal film 18 for second mounting terminal greater in width than the metal film 17 for first mounting terminal is formed on the other one of the main surfaces of the crystal vibration plate 2 to which the second resin film 4 is adhered. The metal film 18 for second mounting terminal, like the second sealing pattern 202, is formed in a rectangular frame-like shape in a manner that surrounds the vibrating portion 21. This may promise firm adhesion of the second resin film 4 to this rectangular region.

The metal film 17 for first mounting terminal is formed along a peripheral edge on the other one of the short sides (left side on FIG. 5) and peripheral edges in part of the opposing long sides of the crystal vibration plate 2 rectangular in plan view. This metal film 17 is formed in a manner that surrounds the second extended portion 202*b* of the second sealing pattern 202. This may ensure that the second resin film 4 is firmly bonded to the peripheral edge on the short side and to the peripheral edges in part of the opposing long sides. When one end on the short side of the crystal vibration plate 2 having the second resin film 4 being adhered thereto is immersed in an electrically conductive paste, as described later, the electrically conductive paste may be successfully blocked by the metal film 17 for first mounting terminal and thereby prevented from advancing into the second extended portion 202*b* of the second sealing pattern 202.

There is an electrode-less region; region where no electrode is formed, between the metal film 17 for first mounting terminal and the second extended portion 202*b* extending along the short-side direction of the crystal vibration plate 2. This electrode-less region is formed to ensure electrical insulation between the first sealing pattern 202 and the metal film 17 for first mounting terminal.

As illustrated in FIG. 3, the first extended portions 201*a* of the first sealing pattern 201 extending in the long-side direction of the crystal vibration plate 2 are smaller in width than the outer frame 23 extending in the long-side direction, and there are electrode-less regions; regions where no electrode is formed, on both sides in the direction of width of the first extended portions 201*a* (vertical direction on FIG. 3).

Of these electrode-less regions on both sides of the first extended portions 201*a*, the outer electrode-less region extends as far as the metal film 17 for first mounting terminal and is continuous to the electrode-less region between the second extended portion 201*b* and the metal film 18 for second mounting terminal. The first extended portions 201*a* and the second extended portion 201*b* of the first sealing pattern 201 are surrounded on their outer side by the electrode-less region substantially equal in width. This electrode-less region extends from the side of the metal film 17 for first mounting terminal along one of the first extended portions 201*a* extending in the long-side direction of the crystal vibration plate 2, then extends from the end of that extension along the second extended portion 201*b*, and then extends from the end of that extension along the other one of the first extended portions 201*a* toward the metal film 17 for first mounting terminal.

An electrode-less region is formed on the inner side in the direction of width of the metal film 17 for first mounting terminal. This electrode-less region is continuous to the electrode-less region on the inner side of the first extended portions 201*a*. On the inner side in the direction of width of the second extended portion 201*b* is formed an electrode-less region except the first extraction electrode 203 at the coupling portion 24. This electrode-less region is continuous to the electrode-less region on the inner side of the first extended portions 201*a*. As result of these structural features, an electrode-less region having a rectangular frame-like shape in plan view is formed on the inner side in the direction of width of the first extended portions 201*a* and the second extended portion 201*b*, except the first extraction electrode 203 at the coupling portion 24.

As illustrated in FIG. 5, the first extended portions 202*a* of the second sealing pattern 202 extending in the long-side direction of the crystal vibration plate 2 are smaller in width than the outer frame 23 extending in the long-side direction. There are electrode-less regions; regions where no electrode region, on both sides in the direction of width of the first extended portions 202*a* (vertical direction on FIG. 5).

Of the electrode-less regions on both sides of the first extended portions 202*a*, the outer electrode-less region is extending as far as the meal film 18 for second mounting terminal. This electrode-less region is continuous to the electrode-less region between the meal film 17 for first mounting terminal and the second extended portion 202*b*. As a result of these structural features, the second extended portion 202*b* and the first extended portions 202*a* of the second sealing pattern 202 are surrounded on their outer side by the electrode-less region substantially equal in width. This electrode-less region extends from the side of the metal film 18 for second mounting terminal along one of the first extended portions 202*a* extending in the long-side direction of the crystal vibration plate 2, then extends from the end of that extension along the second extended portion 202*b*, and further extends from the end of that extension along the other one of the first extended portions 202*a* toward the metal film 18 for second mounting terminal.

On the inner side in the direction of width of the metal film 18 for second mounting terminal is formed an electrode-less region except the second extraction electrode 204 at the coupling portion 24. This electrode-less region is continuous to the electrode-less region on the inner side of the first extended portions 202*a*. On the inner side in the direction of width of the second extended portion 202*b* is formed an electrode-less region. This electrode-less region is continuous to the electrode-less region on the inner side the first extended portions 202*a*. As a result of these structural features, the electrode-less region having a rectangular frame-like shape is formed on the inner side in the direction of width of the metal film 18 for second mounting terminal, first extended portions 202*a* and the second extended portion 202*b*, except the second extraction electrode 204 at the coupling portion 24.

As described earlier, the first extended portions 201*a* and 202*a* of the first and second sealing patterns 201 and 202 are smaller in width than the outer frame 23, the electrode-less regions are formed on both sides in the direction of width of the first extended portions 201*a* and 202*a*, and the electrode-less regions are formed on the inner side in the direction of width of the metal films 17 and 18 for first and second mounting terminals and the second extended portions 201*b* and 202*b*. To form these electrode-less regions, the first and second sealing patterns 201 and 202 extended around the lateral surfaces of the outer frame 23 at the time of sputtering are subjected to patterning using photolithography and then removed by metal etching. This may successfully avoid the risk of short circuit that possibly occurs when the first and second sealing patterns 201 and 202 are extended around and left on the lateral surfaces of the outer frame 23.

The first and second resin films 3 and 4 are joined to the main surfaces of the crystal vibration plate 2 thus structured, and the first and second mounting terminals 27 and 28 are formed as described later. As a result, the crystal vibrator 1 illustrated in FIG. 1 is obtained.

Next, the crystal vibrator 1 illustrated in FIG. 1 is described.

Figure 6:
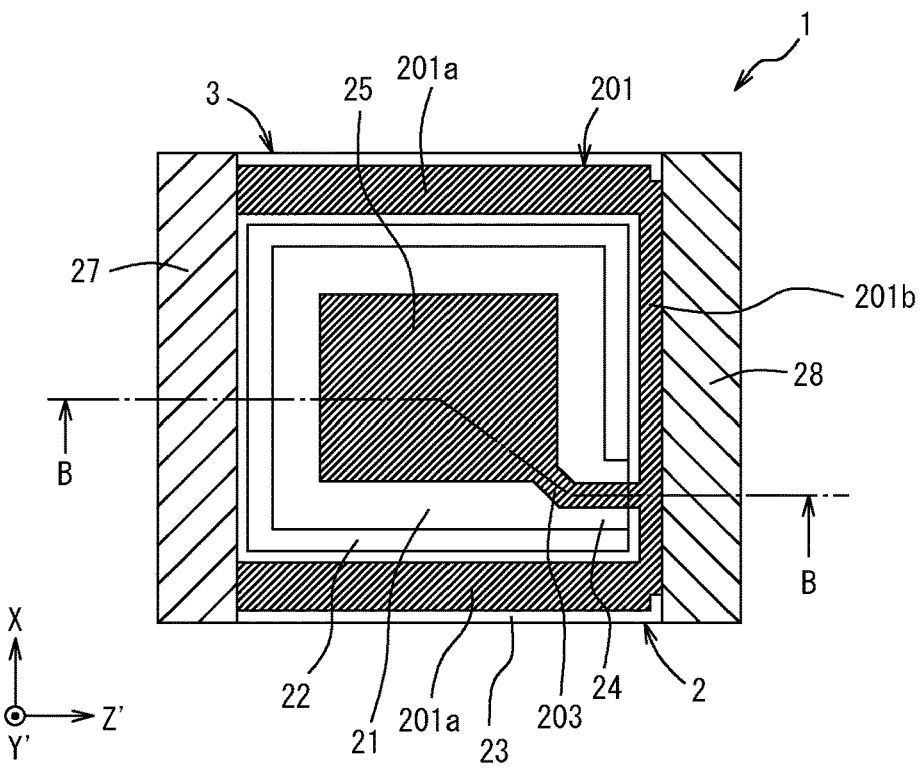
FIG. 6 is a schematic plan view of the crystal vibrator illustrated in FIG. 1.

FIG. 6 is a schematic plan view of the crystal vibrator 1 illustrated in FIG. 1. FIG. 7 is a schematic view in cross section of FIG. 6 along B-B line. FIG. 8 is a schematic bottom view of the crystal vibrator 1. In FIGS. 7 and 13D to 13F described later, the thicknesses of resin films may be exaggerated for the purpose of illustration.

This crystal vibrator 1 has a cuboidal shape and is rectangular in plan view like the crystal vibration plate 2 described earlier. In this embodiment, the crystal vibrator 1 is relatively small in size and height; 1.2 mm×1.0 mm square, and is 0.2 mm in thickness.

The size and thickness of the crystal vibrator 1 are not necessarily thus limited. The crystal vibrator 1 may be formed in other sizes, to which this invention is applicable likewise.

The first and second resin films 3 and 4 are rectangular films adhered to the main surfaces of the crystal vibration plate 2 to cover and seal the vibrating portion 21 of the crystal vibration plate. In this embodiment, the first and second resin films 3 and 4 and the crystal vibration plate 2 rectangular in plan view are sized likewise. These resin films 3 and 4 are adhered to the outer frame 23 of the crystal vibration plate 2 in a manner that covers the thinner vibrating portion 21.

By thus adhering the first and second resin films 3 and 4 to the outer frame 3 to cover the thinner vibrating portion 21, an internal space is formed, in which the vibrating portion is enclosed and sealed.

In this embodiment, after the first and second resin films 3 and 4 are adhered to the main surfaces of the crystal vibration plate 2 rectangular in plan view, an electrically conductive paste is applied to both ends in the long-side direction of the resin film-adhered crystal vibration plate 2 in a manner that covers the first and second resin films 3 and 4 and substantially the whole outer surface of the crystal vibration plate 2. Then, the electrically conductive paste is thermally cured to form the first and second mounting terminals 27 and 28.

At one of the both ends of the crystal vibration plate 2 in the long-side direction (upper surface on FIG. 7), the first mounting terminal 27 is formed on a surface opposite to the surface to which the first resin film 3 has been adhered and on an end surface of the first resin film 3, and is also formed on a surface opposite to the surface to which the second resin film 4 has been adhered (lower surface on FIG. 7) and on an end surface of the second resin film 4.

At one of the both ends of the crystal vibration plate 2 in the long-side direction, the first mounting terminal 27 is further formed on end surfaces on the opposing long sides and on an end surface on one of the opposing short sides. At one of the both ends of the crystal vibration plate 2 in the long-side direction, the metal film 17 for first mounting terminal is formed on the main surfaces of the crystal vibration plate 2, end surfaces on the opposing long sides and an end surface on one of the opposing short sides. The first mounting terminal 27, therefore, is formed on the metal film 17 for first mounting terminal formed on the end surfaces on the opposing long sides and the end surface on one of the opposing short sides. The first mounting terminal 27 is thus electrically connected to the metal film 17 for first mounting terminal.

At the other one of the both ends of the crystal vibration plate 2 in the long-side direction (upper surface on FIG. 7), the second mounting terminal 28 is formed on a surface opposite to the surface to which the first resin film 3 has been adhered and on an end surface of the first resin film 3, and is also formed on a surface opposite to the surface to which the second resin film 4 has been adhered (lower surface on FIG. 7) and on an end surface of the second resin film 4.

At the other one of the both ends of the crystal vibration plate 2 in the long-side direction, the second mounting terminal 28 is further formed on end surfaces on the opposing long sides and on an end surface on one of the opposing short sides. The metal film 18 for second mounting terminal is formed on the main surfaces of the crystal vibration plate 2, end surfaces on the opposing long sides and an end surface on the other one of the opposing short sides. The second mounting terminal 28, therefore, is formed on the metal film 18 for second mounting terminal formed on the end surfaces on the opposing long sides and the end surface on the other one of the opposing short sides. The second mounting terminal 28 is thus electrically connected to the metal film 18 for second mounting terminal.

The first and second mounting terminals 27 and 28, which are electrically connected to the metal films 17 and 18 for first and second mounting terminals of the crystal vibration plate 2, are thus formed on the outer surfaces of the first and second resin films 3 and 4 adhered to the crystal vibration plate 2. This may allow the vibrating portion to be enlarged in size as compared with the first and second mounting terminal being directly formed on the crystal vibration plate 2.

Figure 12:
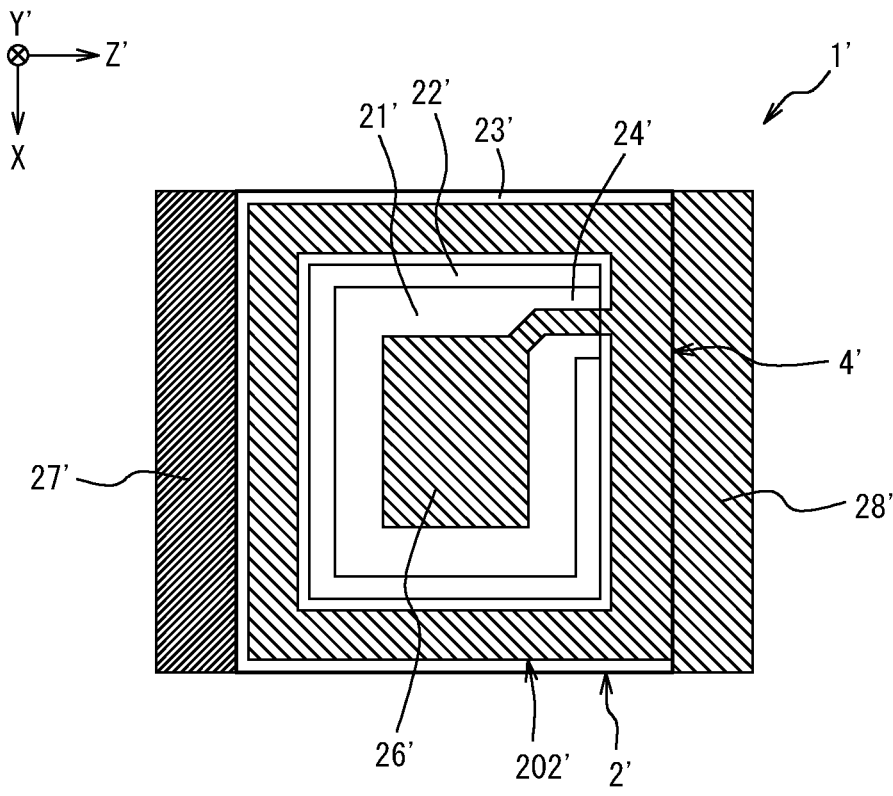
FIG. 12 is a schematic bottom view of the crystal vibrator illustrated in FIG. 9.

FIG. 9 is a schematic perspective view of a crystal vibrator 1' including a crystal vibration plate 2' mounted with first and second mounting terminals 27' and 28'. FIG. 10 is a schematic plan view of the crystal vibrator 1' illustrated in FIG. 9. FIG. 11 is a schematic view in cross section of FIG. 10 along A-A line. FIG. 12 is a schematic bottom view of the crystal vibrator 1' illustrated in FIG. 9.

FIGS. 9, 10, 11 and 12 are drawings illustrated correspondingly to FIGS. 1, 6, 7 and 8. This crystal vibrator 1' has the same outer dimensions as the crystal vibrator 1 according to this embodiment.

In a manner similar to this embodiment, the crystal vibration plate 2' of the crystal vibrator 1' illustrated in FIGS. 9 to 12 includes a vibrating portion 21', an outer frame 23', and a coupling portion 24'. The vibrating portion 21' is substantially rectangular in plan view. The outer frame 23' surrounds the vibrating portion 21' with a penetrating portion 22' being interposed therebetween. The coupling portion 24' couples the vibrating portion 21' to the outer frame 23'. A pair of first and second driving electrodes 25' and 26' are respectively formed on front and back main surfaces of the vibrating portion 21'. A first sealing pattern 201' and a second sealing pattern 202' are formed on front and back main surfaces of the crystal vibration plate 2'.

In the crystal vibrator 1', the first and second mounting terminals 27' and 28' are formed at ends on both sides of the crystal vibration plate 2' in the long-side direction. The first and second resin films 3' and 4' are reduced in length along the long-side direction of the crystal vibration plate 2' to allow exposure of a joining area required for mounting of the first and second mounting terminals 27' and 28'. The vibrating portion 21' sealed with the first and second resin films 3' and 4' is also reduced in length in the long-side direction of the crystal vibration plate 2'.

In this embodiment, the first and second mounting terminals 27 and 28 are not directly formed on the crystal vibration plate 2 but are formed on the outer surfaces of the first and second resin films 3 and 4 adhered to the crystal vibration plate 2. As illustrated in FIG. 7, the metal films 17 and 18 for first and second mounting terminals formed on the crystal vibration plate 2 may be accordingly reduced in length in the long-side direction of this vibration plate, as compared with the first and second mounting terminals 27' and 28' of FIG. 11. Thus, the vibrating portion 21 between the metal films 17 and 18 for first and second mounting terminals may be formed in a grater length in the long-side direction than the vibrating portion 21' of FIG. 11.

Thus, the vibrating portion 21 may be increased in length for better vibration characteristics without having to enlarge the piezoelectric vibration plate 2. Further advantageously, the first and second mounting terminals 27 and 28 may be allowed to secure an adequate joining area required for mounting purpose of the piezoelectric vibration device 1.

In this embodiment, the first and second resin films 3 and 4 are heat-resistant films, for example, films made of a polyimide resin having heat resistance to high temperatures up to approximately 300° C. The first and second resin films 3 and 4 made of a polyimide resin are essentially transparent, however, may possibly be opaque under the conditions of pressure bonding under heat which will be described later. The first and second resin films 3 and 4 may be optionally transparent, semi-transparent, or opaque.

The material(s) of the first and second resin films 3 and 4 may not necessarily be selected from the polyimide resins and may be selected from resins classified in the category of super engineering plastics, specific examples of which may include polyamide resins and polyether ether ketone resins.

The first and second resin films 3 and 4 have thermoplastic adhesive layers in the entire areas of their front and back surfaces. In the first and second resin films 3 and 4, circumferential ends of their rectangular shapes are joined under heat, for example, by hot pressing, to the outer frame 23 on the front and back surfaces of the crystal vibration plate 2 in a manner that the vibrating portion 21 is sealed with these resin films.

By thus using the heat-resistant resin films as the first and second resin films 3 and 4, the first and second resin films 3 and 4 may be resistant to high temperatures and thus unlikely to deform during the reflow soldering when the crystal vibrator 1 is mounted by soldering to, for example, a circuit board.

The meal films 17 and 18 for first and second mounting terminals, first and second sealing patterns 201 and 202, first and second extraction electrodes 203 and 204, and first and second driving electrodes 25 and 26 of the crystal vibration plate 2 may each include, for example, a ground layer made of Ti or Cr, an Au layer formed on the ground layer, and a Ti, Cr or Ni layer further formed thereon.

In this embodiment, the ground layer is a Ti layer with Au and Ti layers stacked thereon. The uppermost layer using Ti may favorably increase an adhesive strength to the polyimide resin than the uppermost layer using Au.

Thus, Ti, Cr or Ni (or an oxide obtained therefrom) is used in the upper layers of the first and second sealing patterns 201 and 202 and the metal films 17 and 18 for first and second mounting terminals to which the rectangular first and second resin films 3 and 4 are adhered, which may provide an improved adhesive strength to the first and second resin films 3 and 4.

Next, a manufacturing method for the crystal vibrator 1 according to this embodiment is hereinafter described.

FIGS. 13A to 13F are schematic views in cross section of steps of manufacturing the crystal vibrator 1.

Figure 13B:
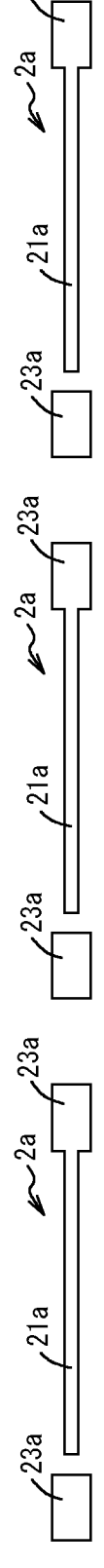
FIG. 13B is a schematic view in cross section of steps of manufacturing the crystal vibrator illustrated in FIG. 1.

First, an unprocessed crystal wafer (AT-cut crystal plate) 5 is prepared, which is illustrated in FIG. 13A. Then, an external shape forming step is performed to process the crystal wafer 5, as illustrated in FIG. 13B. In this step, outer shapes of crystal substrate pieces 2a and frame pieces supporting these substrate pieces (not illustrated in the drawings) are formed by photolithography and etching, for example, wet etching, as illustrated in FIG. 13B, and the crystal substrate pieces 2a are each processed to have an outer frame 23a and a vibrating portion 21a thinner than the outer frame 23a.

The crystal substrate pieces 2a are supportably coupled to one another with the frame pieces in a matrix-like form column-wise and row-wise which are vertical and lateral directions on FIG. 13B.

Next, a crystal vibration plate forming step is performed, as illustrated in FIG. 13C. In this step, first and second driving electrodes 25a and 26a and metal films 17a and 18a for first and second mounting terminals are formed at predetermined positions of the crystal substrate pieces 2a by sputtering or vapor deposition and photolithography, thus obtaining crystal vibrations plates 2b.

Figure 13D:
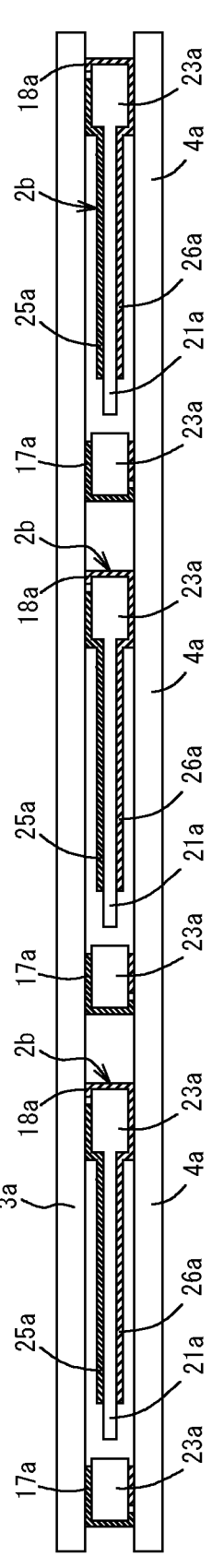
FIG. 13D is a schematic view in cross section of steps of manufacturing the crystal vibrator illustrated in FIG. 1.

Next, an adhering step is performed, as illustrated in FIG. 13D. In this step, resin films 3a and 4a are adhered by pressure bonding under heat to entire main surfaces of the crystal vibration plates 2b supportably coupled to one another in a matrix-like form, and these surfaces are thus covered with the continuous resin films 3a and 4a to seal the vibrating portions 21a of the crystal vibration plates 2b.

The vibrating portions 21a are thus sealed with the resin films 3a and 4a in an inactive gas atmosphere using, for example, nitrogen gas.

Then, a dividing step is performed, as illustrated in FIG. 13E, in which the matrix-like crystal vibration plates 2b having the resin films 3a and 4a being adhered thereto are divided in one direction alone; column-wise (vertical direction on FIG. 13E). In this step, the resin films 3a and 4a are cut column-wise like the crystal vibration plate 2b to remove any unneeded parts.

FIG. 14 is a plan view illustrating an example of column-wise division into the crystal vibration plates 2b. In this drawing is illustrated a simplified division, showing six crystal vibration plates 2b arranged in three rows and two columns.

This portion illustrated in FIG. 14 is divided column-wise; vertically, into a plurality of crystal vibration plates 2b, for example, three crystal vibration plates 2b, as illustrated with a broken line L. Thus, the crystal vibration plates 2b may be handled column-wise.

In other embodiments of this invention, the crystal vibration plates 2b may be divided and handled row-wise, instead of column-wise.

Then, a mounting terminal forming step is performed. In this step, ends on both sides of the crystal vibration plates 2b divided per column are immersed in an electrically conductive paste containing silver or copper, and the electrically conductive paste is then thermally cured to form the first and second mounting terminals 27 and 28. This step is followed by a separating step in which the crystal vibration plates 2b mounted with the first and second mounting terminals 27 and 28 are separated into individual pieces. As result, a plurality of crystal vibrators 1 are obtained as illustrated in FIG. 13F. The electrically conductive paste used in this embodiment may be a silver-containing paste or a copper-containing paste. The silver-containing paste specifically contains, as electrically conductive fillers, silver (Ag), nickel (Ni) and palladium (Pd). Examples of a binder resin of the silver-containing paste may include epoxy resins, imide resins, urethane resins and silicone resins.

In the mounting terminal forming step, both ends of the crystal vibration plates 2b are immersed in an electrically conductive paste, and the electrically conductive paste is then thermally cured to form the first and second mounting terminals 27 and 28, as illustrated in FIGS. 13E and 13F. The first and second mounting terminals 27 and 28 are thus electrically connected to the metal films 17 and 18 for first and second mounting terminals of the crystal vibration plate 2. As a result, the ends of the crystal vibration plate 2b to which the first and second resin films 3 and 4 have been adhered are covered with the first and second mounting terminals 27 and 28 consisting of layers of the electrically conductive fillers and binder resin.

When the ends of the first, second film-adhered crystal vibration plate 2b are immersed in an electrically conductive paste and the electrically conductive paste is then thermally cured, the first and second mounting terminals 27 and 28 may be easily formed. Thus, the production cost may be favorably reduced, as compared with the first and second mounting terminals being formed by, for example, sputtering or vapor deposition The crystal vibration plates are divided in one direction alone in the dividing step described earlier. In other embodiments of this invention, the crystal vibration plates may be divided in two directions; in one direction and another direction orthogonal to this one direction.

According to this embodiment, the vibrating portion 21 may be dimensionally increased in the long-side direction of the crystal vibration plate 2 for better vibration characteristics without having to enlarge the piezoelectric vibrator 1. Further advantageously, the first and second mounting terminals 27 and 28 may be allowed to secure an adequate joining area required for mounting purpose of the piezoelectric vibration device 1.

Conventionally, piezoelectric vibration pieces may be each housed in a box-shaped base equipped with mounting terminals and having an opening on its upper side. The crystal vibrator 1 described herein has, on the outer surfaces of the first and second resin films 3 and 4 adhered to the crystal vibration plate 2, the first and second mounting terminals 27 and 28 that are respectively connected to the first and second driving electrodes 25 and 26. This makes such a conventional means unnecessary, eliminating the need for high-priced bases.

The first and second resin films 3 and 4 are adhered to the main surfaces of the piezoelectric vibration plate 2 to seal the first and second driving electrodes 25 and 26. This may conduce to lower production cost than use of a metal-made or glass-made lid for sealing.

This may lead to less production cost, allowing the crystal vibrator 1 to be inexpensively produced.

Further, the obtained products may be reduced in thickness (in height), as compared with the known art in which piezoelectric vibration pieces are each housed in a box-shaped base and sealed with a lid member.

In the crystal vibrator 1 according to this embodiment, the vibrating portion 21 is sealed with the first and second resin films 3 and 4. The crystal vibrator 1 thus sealed with the resin films may be relatively inferior in air-tightness, as compared with the known art in which, for example, a vibration piece-mounted base is air-tightly sealed with a metal-made or glass-made lid member joined to the base. As a result, the resonance frequency of such a crystal vibrator 1 may be more likely to degrade with time than in the known art.

Among all of the applications associated with the near field communication, the standards for frequency deviations may be moderately regulated for BLE (Bluetooth (registered trademark) Low Energy). The crystal vibrator 1, which is an inexpensive resin film-sealed vibrator, may be useful in such moderately regulated applications.

In the embodiment described earlier, the vibrating portion 21 is increased in length in the Z'-axis direction of the crystal vibration plate 2. In other embodiments of this invention, the vibrating portion 21 may be increased in length in the X-axis direction of the crystal vibration plate 2. In this instance, the first and second mounting terminals 27 and 28 may preferably be formed at both ends in the X-axis direction of the crystal vibration plate 2. In the embodiment described earlier, the coupling portion 24 is formed at one position in one corner of the vibrating portion 21 substantially rectangular in plan view. The coupling portion(s) 24 may be formed at a different position(s), and the coupling portion(s) 24 may be variable in width.

Instead of the crystal vibration plate provided with the penetrating portion, this invention is applicable to a crystal vibration plate having a reverse mesa structure in which the vibrating portion is reduced in thickness and its surrounding area is increased in thickness.

In the embodiment described earlier, the first and second resin films 3 and 4 are adhered to the main surfaces on both sides of the crystal vibration plate 2. Instead, a resin film and a conventional lid may be both prepared and respectively joined to one and the other one of the main surfaces of the crystal vibration plate 2 to seal the vibrating portion 21.

In the earlier embodiment, the metal films 17 and 18 for first and second mounting terminals are formed on the main surfaces of the crystal vibration plate 2 and on the end surfaces of the opposing long sides and the opposing short sides of the crystal vibration plate 2. Insofar as the metal films 17 and 18 for first and second mounting terminals are electrically connectable to the first and second mounting terminals 27 and 28, the metal films 17 and 18 for first and second mounting terminals may instead be formed on at least one of the following: the main surfaces of the crystal vibration plate 2, the end surfaces of the opposing long sides of the crystal vibration plate 2, or the end surfaces of the opposing short sides of the crystal vibration plate 2.

In the earlier embodiment, the first and second resin films 3 and 4 are large enough to cover the whole main surfaces of the crystal vibration plate 2. Instead, the first and second resin films 3 and 4 may be so sized that these films are adherable to both ends in the long-side direction of the crystal vibration plate 2.

In the earlier embodiment, the first sealing pattern 201 is formed, with the metal film 17 for first mounting terminal, on one of the main surfaces of the crystal vibration plate 2, and this sealing pattern is formed in a rectangular frame-like shape in a manner that surrounds the substantially rectangular vibrating portion 21, as illustrated in FIG. 3. Further, the second sealing pattern 202 is formed, with the metal film 18 for second mounting terminal, on the other one of the main surfaces of the crystal vibration plate 2, and this sealing pattern is formed in a rectangular frame-like shape in a manner that surrounds the substantially rectangular vibrating portion 21, as illustrated in FIG. 5. These rectangular, frame-like sealing patterns 201 and 202 may instead be dispensable and unused.

FIGS. 16 and 17 are a schematic plan view and a schematic bottom view of a crystal vibration plate $2_1$ in which the first and second sealing patterns 201 and 202 are unused. These drawings are illustrated correspondingly to FIGS. 3 and 5 of the earlier embodiment.

In this crystal vibration plate $2_1$, metal films $17_1$ and $18_1$ for first and second mounting terminals are formed at peripheral ends of the opposing short sides on the main surfaces of the crystal vibration plate $2_1$.

As illustrated in FIG. 16, the metal film $17_1$ for first second mounting terminal formed at a peripheral end of one of the opposing short sides is electrically connected to the first driving electrode 25 through a routing electrode 205 and the first extraction electrode 203.

As illustrated in FIG. 17, the metal film $18_1$ for second mounting terminal formed at a peripheral end on the other one of the opposing short sides is electrically connected to the second driving electrode 26 through the second extraction electrode 204 extended therefrom.

Any other structural features are similar to those of the earlier embodiment.

In the crystal vibration plate $2_1$ not using the rectangular, frame-like first and second sealing patterns 201 and 202, a photosensitive resin film(s) may be used as the resin film.

For example, a crystal wafer may be prepared in which crystal vibration plates $2_1$ are arranged in a matrix-like form, as illustrated in FIG. 13D. In this instance, a photosensitive resin film is adhered to both of main surfaces of the crystal wafer and then exposed to light and developed so as to cover the first and second driving electrodes of the crystal vibration plates $2_1$ and is also subjected to patterning to remove any unneeded parts. After that, the crystal vibration plates $2_1$ on the wafer are divided column-wise, immersed in an electrically conductive paste. Then, the electrically conductive paste is thermally cured, and the crystal vibration plates $2_1$ are then separated into individual pieces.

In other embodiments of this invention, a metal film 29 may be formed on the first and second mounting terminals 27 and 28 to improve soldering properties.

The metal film 29 may consist of a single layer or a plurality of layers. The mono-layer metal film 29 may preferably consist of a nickel (Ni) layer, a tin (Sn) layer or a gold (Au) layer. The bi-layer metal film 29 may preferably consist of Ni—Sn layers, Ni—Au layers or Ni—Cu layers. The tri-layer metal film 29 may preferably consist of Cu—Ni—Sn layers or Cu—Ni—Au layers.

The shape of the crystal vibration plate may be substantially rectangular in plan view, instead of an exactly rectangular shape in plan view described earlier. In some exemplified shapes, the crystal vibration plate may have chamfered corner parts or may have castellations obtained by depositing electrodes in cutouts formed at the peripheral edges in the direction of thickness.

This invention is not necessarily limited to piezoelectric vibrators including crystal vibrators and may be applicable to piezoelectric vibration devices including piezoelectric oscillators.

REFERENCE SIGNS LIST

1, $1_2$ crystal vibrator
2, $2_1$ crystal vibration plate
3 first resin film
4 second resin film
5 crystal wafer
17 metal film for first mounting terminal
18 metal film for first mounting terminal
21 vibrating portion
23 outer frame
24 coupling portion
25 first driving electrode
26 second driving electrode
27 first mounting terminal
28 second mounting terminal
201 first sealing pattern
202 second sealing pattern

The invention claimed is:

1. A piezoelectric vibration device comprising a piezoelectric vibration plate, the piezoelectric vibration plate comprising:
   a vibrating portion having a first driving electrode and a second driving electrode; and
   metal films for first and second mounting terminals, the metal films being respectively connected to the first driving electrode and the second driving electrode,
   the piezoelectric vibration device further comprising
   a first sealing member and a second sealing member adherable to main surfaces on both sides of the piezoelectric vibration plate in a manner that cover the first driving electrode and the second driving electrode formed on the main surfaces of the piezoelectric vibration plate, at least one of the first sealing member or the second sealing member being a film including a resin,
   the metal film for first mounting terminal being formed at one of ends on both sides of the piezoelectric vibration plate across the vibrating portion,
   the metal film for second mounting terminal being formed at another one of the ends on both sides of the piezoelectric vibration plate across the vibrating portion,
   ends on both sides of the film being adhered to the ends on both sides of the piezoelectric vibration plate across the vibrating portion,
   the piezoelectric vibration device further comprising:
   a first mounting terminal connected to the metal film for first mounting terminal, the first mounting terminal being formed in a manner that covers an outer surface of the film at one of the ends on the both sides thereof; and
   a second mounting terminal connected to the metal film for second mounting terminal, the second mounting terminal being formed in a manner that covers the outer surface of the film at another one of the ends on the both sides thereof,
   the piezoelectric vibration plate further comprising an outer frame coupled to the vibrating portion through a coupling means,
   the outer frame surrounding, at a position spaced from the vibrating portion, an outer circumference of the vibrating portion smaller in thickness,
   each of the metal films for first and second mounting terminals being formed on the outer frame, respectively,
   the first and second sealing members each being adhered to the outer frame in a manner that seals the first driving electrode and the second driving electrode,
   one of main surfaces on both sides of the outer frame has a first sealing pattern to which the first sealing member is adherable, the first sealing pattern being connected to the metal film for first mounting terminal and surrounding the vibrating portion with the metal film for first mounting terminal, and
   another one of main surfaces of the outer frame has a second sealing pattern to which the second film is adherable, the second sealing pattern being connected to the metal film for second mounting terminal and surrounding the vibrating portion with the metal film for second mounting terminal,
   the first sealing pattern and the second sealing pattern each having an extended portion being smaller in width than the outer frame,
   wherein
   there is no electrode region on both sides in the direction of width of the extended portion of each of the first and second sealing patterns.

2. The piezoelectric vibration device according to claim 1, wherein
   the first sealing member and the second sealing member are a first film and a second film including the resin,
   ends on both sides of the first film and of the second film are adhered to the ends on both sides of the piezoelectric vibration plate across the vibrating portion,
   the first mounting terminal connected to the metal film for first mounting terminal is formed in a manner that covers outer surfaces of the first film and of the second film at the ends on one of the both sides thereof, and
   the second mounting terminal connected to the metal film for second mounting terminal is formed in a manner that covers the outer surfaces of the first film and of the second film at the ends on another one of the both sides thereof.

3. The piezoelectric vibration device according to claim 2, wherein
   the first mounting terminal is formed in a manner that covers all of the outer surfaces of the first film and of the second film at the ends on one of the both sides thereof and that covers a whole outer surface of the piezoelectric vibration plate at one of the ends on the both sides thereof across the vibrating portion, and
   the second mounting terminal is formed in a manner that covers all of the outer surfaces of the first film and of the second film at the ends on another one of the both sides thereof and that covers the whole outer surface of the piezoelectric vibration plate at another one of the ends on the both sides thereof across the vibrating portion.

4. The piezoelectric vibration device according to claim 3, the metal films for first and second mounting terminals are formed on an end surface and main surfaces on both sides of the outer frame and the first film and the second film are adhered to the metal films for first and second mounting terminals formed on the main surfaces of the outer frame.

5. The piezoelectric vibration device according to claim 3, wherein the metal films for first and second mounting terminals are formed on an end surface and main surfaces on both sides of the outer frame and the first film and the second film are adhered to the metal films for first and second mounting terminals formed on the main surfaces of the outer frame.

6. The piezoelectric vibration device according to claim 1, wherein the first mounting terminal and the second mounting terminal are formed by curing an electrically conductive paste.

7. The piezoelectric vibration device according to claim 1, wherein the film or the first and second films are a film including a heat-resistant resin.

8. The piezoelectric vibration device according to claim 1, wherein the film or the first and second films comprise, on at least one surface thereof, a thermoplastic adhesive layer.

9. The piezoelectric vibration device according to claim 1, wherein the piezoelectric vibration plate is a crystal vibration plate.

\* \* \* \* \*